(12) United States Patent
Hsueh et al.

(10) Patent No.: US 11,354,930 B2
(45) Date of Patent: Jun. 7, 2022

(54) OPTICAL FINGERPRINT IDENTIFICATION SYSTEM

(71) Applicant: LARGAN PRECISION CO., LTD., Taichung (TW)

(72) Inventors: Chun-Che Hsueh, Taichung (TW); Hsiang-Chi Tang, Taichung (TW); Tsung-Han Tsai, Taichung (TW); Fuh-Shyang Yang, Taichung (TW)

(73) Assignee: LARGAN PRECISION CO., LTD., Taichung (TW)

(*) Notice: Subject to any disclaimer, the term of this patent is extended or adjusted under 35 U.S.C. 154(b) by 0 days.

(21) Appl. No.: 17/194,610

(22) Filed: Mar. 8, 2021

(65) Prior Publication Data
US 2022/0113831 A1 Apr. 14, 2022

(30) Foreign Application Priority Data
Oct. 8, 2020 (TW) .................................. 109134906

(51) Int. Cl.
G06V 40/13 (2022.01)
G06F 3/042 (2006.01)
H01L 27/30 (2006.01)

(52) U.S. Cl.
CPC ........ *G06V 40/1318* (2022.01); *G06F 3/0421* (2013.01); *H01L 27/307* (2013.01)

(58) Field of Classification Search
CPC .. G06F 3/0421; G06V 40/1318; H01L 27/307
See application file for complete search history.

(56) References Cited

U.S. PATENT DOCUMENTS

| 9,225,888 | B2 | 12/2015 | Huang | |
|---|---|---|---|---|
| 2018/0270404 | A1 | 9/2018 | Ishida et al. | |
| 2020/0049955 | A1* | 2/2020 | Chiu | G02B 13/04 |
| 2021/0174053 | A1* | 6/2021 | Nam | G06V 40/1318 |
| 2021/0201063 | A1* | 7/2021 | Wang | G06V 10/145 |

FOREIGN PATENT DOCUMENTS

| CN | 108428725 A | 8/2018 |
|---|---|---|
| CN | 111164611 A | 5/2020 |
| TW | 201719916 A | 6/2017 |
| TW | 202020484 A | 6/2020 |

OTHER PUBLICATIONS

TW Office Action in Application No. 109134906 dated Sep. 23, 2021.

* cited by examiner

*Primary Examiner* — Premal R Patel
(74) *Attorney, Agent, or Firm* — Maschoff Brennan

(57) ABSTRACT

An optical fingerprint identification system includes a cover, a light emitting layer, an optical layer, an image sensor and a base that are sequentially disposed from top to bottom. The cover has a fingerprint contact surface on top. The image sensor has an image surface. The optical layer includes a first array layer and a second array layer, and the first array layer is stacked on top of the second array layer. The first array layer and the second array layer respectively include a plurality of first array lens elements and a plurality of second array lens elements respectively arranged at equal intervals in a first direction. Each of the first array lens elements and a corresponding second array lens element of the second array layer are coaxial along an optical axis and form an imaging unit.

30 Claims, 18 Drawing Sheets

OPTICAL FINGERPRINT IDENTIFICATION SYSTEM

RELATED APPLICATIONS

This application claims priority to Taiwan Application 109134906, filed on Oct. 8, 2020, which is incorporated by reference herein in its entirety.

BACKGROUND

Technical Field

The present disclosure relates to an optical fingerprint identification system, more particularly to an optical fingerprint identification system including array lens elements.

Description of Related Art

Nowadays, smart mobile devices become more popular than ever. Users can access vast amount of data via smart mobile devices, and these data may refer to personal information. Therefore, data security of smart mobile devices needs to be significantly raised. Currently, there are many types of security systems provided on smart mobile devices on the market, such as graphical password authentication, fingerprint identification and facial recognition systems, among which the fingerprint identification system is most commonly used. Conventionally, a capacitive device is widely used in the fingerprint identification system; but as for now, in order to follow the trend of high screen-to-body ratio of smart mobile devices, in-display fingerprint identification systems rapidly develop. There are two types of in-display fingerprint identification systems: optical and ultrasonic. Between the two types, the optical type has advantages of high identification accuracy and high compatibility with smart mobile devices, thereby the adoption of the optical type becoming widespread.

The optical type of the in-display fingerprint identification system is usually disposed under the display. The display or a lateral light-guiding medium can be a light source to emit light onto user's fingerprint, and then the reflected light off the fingerprint can be projected on a photo sensor under the display via a collimator layer for receiving light, such that the user's fingerprint can be sensed, recorded and then identified. However, this configuration only uses the collimator layer to receive light, which may cause poor fingerprint image quality and thus increase difficulty of fingerprint identification when receiving light at different fields of view. Alternatively, when a micro lens for capturing fingerprint images is disposed under the display to improve fingerprint image quality nowadays, it requires a thicker lens module for light convergence which results in an overall thicker electronic device, and is unfavorable for the miniaturization of the overall electronic device.

SUMMARY

According to one aspect of the present disclosure, an optical fingerprint identification system includes a cover, a light emitting layer, an optical layer, an image sensor and a base. The cover has a fingerprint contact surface on top. The light emitting layer is disposed below the cover. The optical layer is disposed below the light emitting layer. The image sensor is disposed below the optical layer, and the image sensor has an image surface. The base is disposed below the image sensor. The optical layer includes a first array layer and a second array layer, and the first array layer is stacked on top of the second array layer. The first array layer includes a plurality of first array lens elements arranged at equal intervals in a first direction. The second array layer includes a plurality of second array lens elements arranged at equal intervals in the first direction. Each of the first array lens elements and a corresponding second array lens element of the second array layer are coaxial along an optical axis and form an imaging unit.

When a total number of the imaging units in the optical fingerprint identification system is N, an axial distance between the fingerprint contact surface and an upper surface of the first array lens element is OL, and an axial distance between the upper surface of the first array lens element and the image surface is TL, the following conditions are satisfied:

$120 < N < 900$; and $OL + TL < 3.0$ [mm].

According to another aspect of the present disclosure, an optical fingerprint identification system includes a cover, a light emitting layer, an optical layer, an image sensor and a base. The cover has a fingerprint contact surface on top. The light emitting layer is disposed below the cover. The optical layer is disposed below the light emitting layer. The image sensor is disposed below the optical layer, and the image sensor has an image surface. The base is disposed below the image sensor. The optical layer includes a first array layer and a second array layer, and the first array layer is stacked on top of the second array layer. The first array layer includes a plurality of first array lens elements arranged at equal intervals in a first direction. The second array layer includes a plurality of second array lens elements arranged at equal intervals in the first direction. Each of the first array lens elements and a corresponding second array lens element of the second array layer are coaxial along an optical axis and form an imaging unit.

When an axial distance between the fingerprint contact surface and an upper surface of the first array lens element is OL, an axial distance between the upper surface of the first array lens element and the image surface is TL, an object height corresponding to each of the imaging units is YOB, and an image height corresponding to each of the imaging units is YRI, the following conditions are satisfied:

$OL + TL < 3.0$ [mm];

$|YOB/YRI| < 1.5$; and $2.5 < OL/TL$.

BRIEF DESCRIPTION OF THE DRAWINGS

The disclosure can be better understood by reading the following detailed description of the embodiments, with reference made to the accompanying drawings as follows.

DETAILED DESCRIPTION

Figure 1:
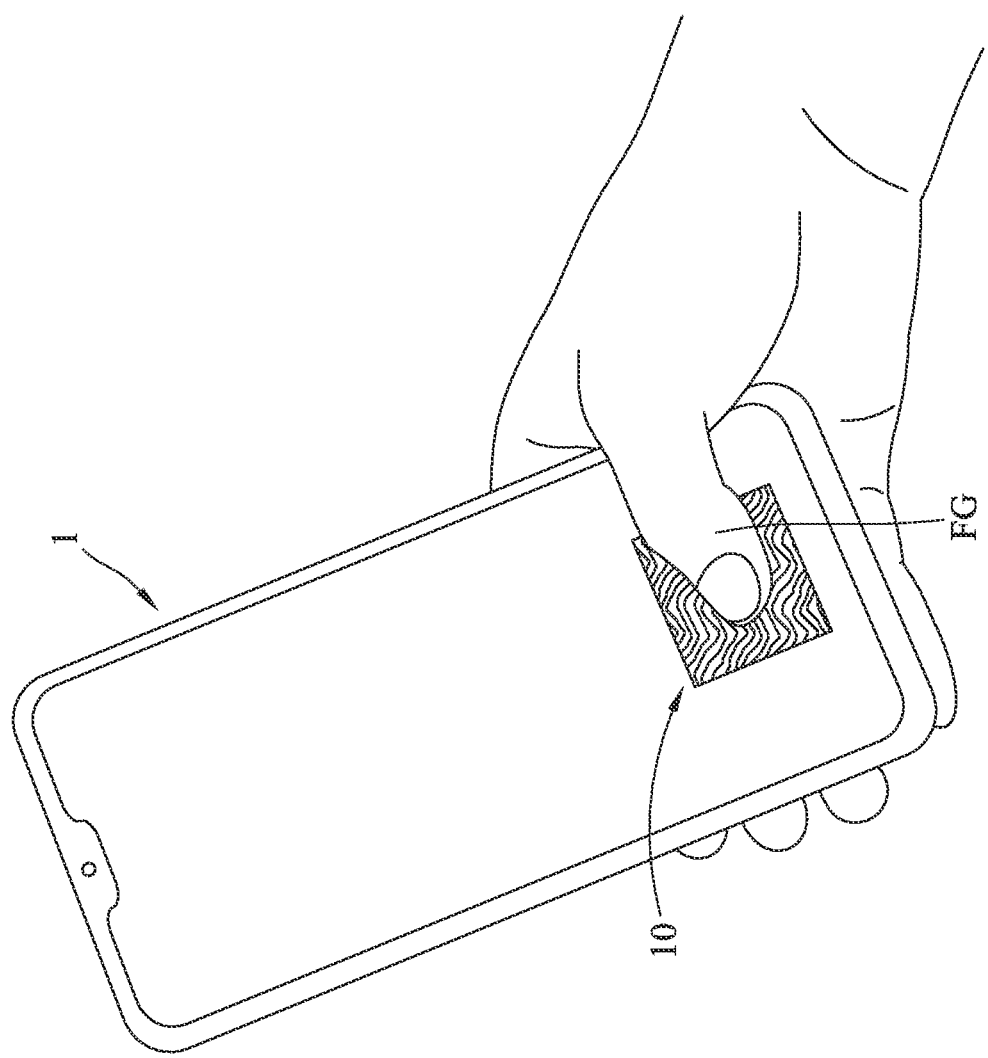
FIG. 1 is a schematic view showing a usage scenario of an optical fingerprint identification system according to the 1st embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The present disclosure provides an optical fingerprint identification system including a cover, a light emitting layer, an optical layer, an image sensor and a base. The cover has a fingerprint contact surface on top. The light emitting layer is disposed below the cover. The optical layer is disposed below the light emitting layer. The image sensor is disposed below the optical layer, and the image sensor has an image surface. The base is disposed below the image sensor.

The optical layer includes a first array layer and a second array layer, and the first array layer is stacked on top of the second array layer. The first array layer includes a plurality of first array lens elements arranged at equal intervals in a first direction. The second array layer includes a plurality of second array lens elements arranged at equal intervals in the first direction. These stacked array layers with wafer-level like stacking are favorable for effectively arranging the array lens elements of the optical layer while providing good light convergence; they are also favorable for effectively increasing fingerprint image quality, achieving fast and high accuracy of fingerprint identification, and reducing the overall thickness so as to miniaturize an applied electronic device.

The plurality of first array lens elements can have positive refractive power. Therefore, it is favorable for converging of the incident light so as to reduce the overall thickness of the optical layer.

The plurality of second array lens elements can have negative refractive power. Therefore, it is favorable for correcting aberrations of the optical fingerprint identification system.

According to the present disclosure, the optical layer can further include a third array layer stacked between the second array layer and the image sensor. The third array layer includes a plurality of third array lens elements arranged at equal intervals in the first direction. Therefore, it is favorable for further correcting aberrations so as to increase image quality.

The plurality of third array lens elements can have positive refractive power. Therefore, it is favorable for providing light convergence at an image side of the optical fingerprint identification system so as to reduce the back focal length and the overall thickness of the optical layer.

Each of the first array lens elements and a corresponding second array lens element of the second array layer are coaxial along an optical axis and form an imaging unit. Moreover, each of the imaging units can further include one of the plurality of third array lens elements corresponding to one of the plurality of first array lens elements or one of the plurality of second array lens elements. The term of "corresponding" described herein refers to one of the plurality of first array lens elements and one of the plurality of second array lens elements respectively having orthogonal projections overlapped with each other on the base; moreover, it can also refer to one of the plurality of third array lens elements having an orthogonal projection overlapped with one of the plurality of first array lens elements or one of the plurality of second array lens elements on the base.

Figure 10:
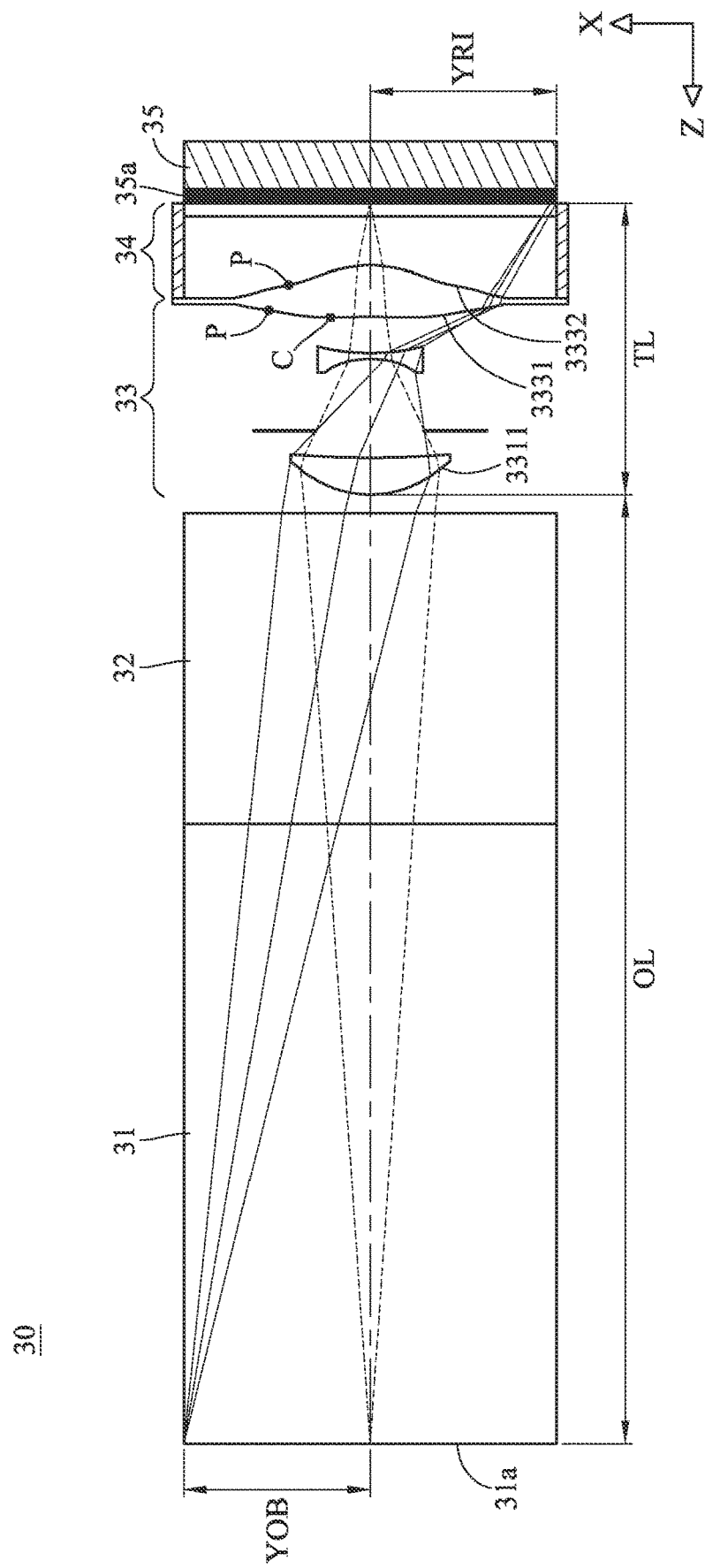
FIG. 10 shows a schematic view of OL, TL, YOB, YRI, several inflection points and a critical point of the array lens elements and imaging paths of the optical fingerprint identification system according to the 2nd embodiment of the present disclosure.

At least one of all array lens elements of the optical layer can have at least one of an upper surface and a lower surface having at least one inflection point. Therefore, it is favorable for correcting off-axis aberrations and improving light convergence in an off-axis region thereof. Moreover, at least one of all array lens elements of the optical layer can have at least one of an upper surface and a lower surface having at least one critical point in an off-axis region thereof. Please refer to FIG. 10, which shows a schematic view of an inflection point P and a critical point C on the upper surface 3331 of the third array lens element 3330 and an inflection point P on the lower surface 3332 of the third array lens element 3330 according to the 2nd embodiment of the present disclosure. The inflection points and the critical point on the upper surface and the lower surface of the third array lens element in FIG. 10 are only exemplary. Another array lens element may also have one or more inflection points or critical points.

The optical layer can further include at least one light-blocking layer disposed above or below one of the first array layer and the second array layer. Therefore, it is favorable for eliminating stray light from the display or another light source.

The optical layer can further include at least one filter coating layer disposed on at least one of an upper surface and a lower surface of at least one of all array lens elements of the optical layer. Therefore, it is favorable for restricting the range of the light passable bandwidth so as to eliminate stray light with a specific bandwidth. Please refer to FIG. 12, which is a schematic view of an imaging unit and an image sensor coupled with a filter coating layer of the optical fingerprint identification system according to the 7th embodiment of the present disclosure, wherein the filter coating layer 837 is disposed on the lower surface 8332 of the third array lens element 8330 in the imaging unit UNIT_8 so as to filter light with a specific bandwidth.

Figure 14:
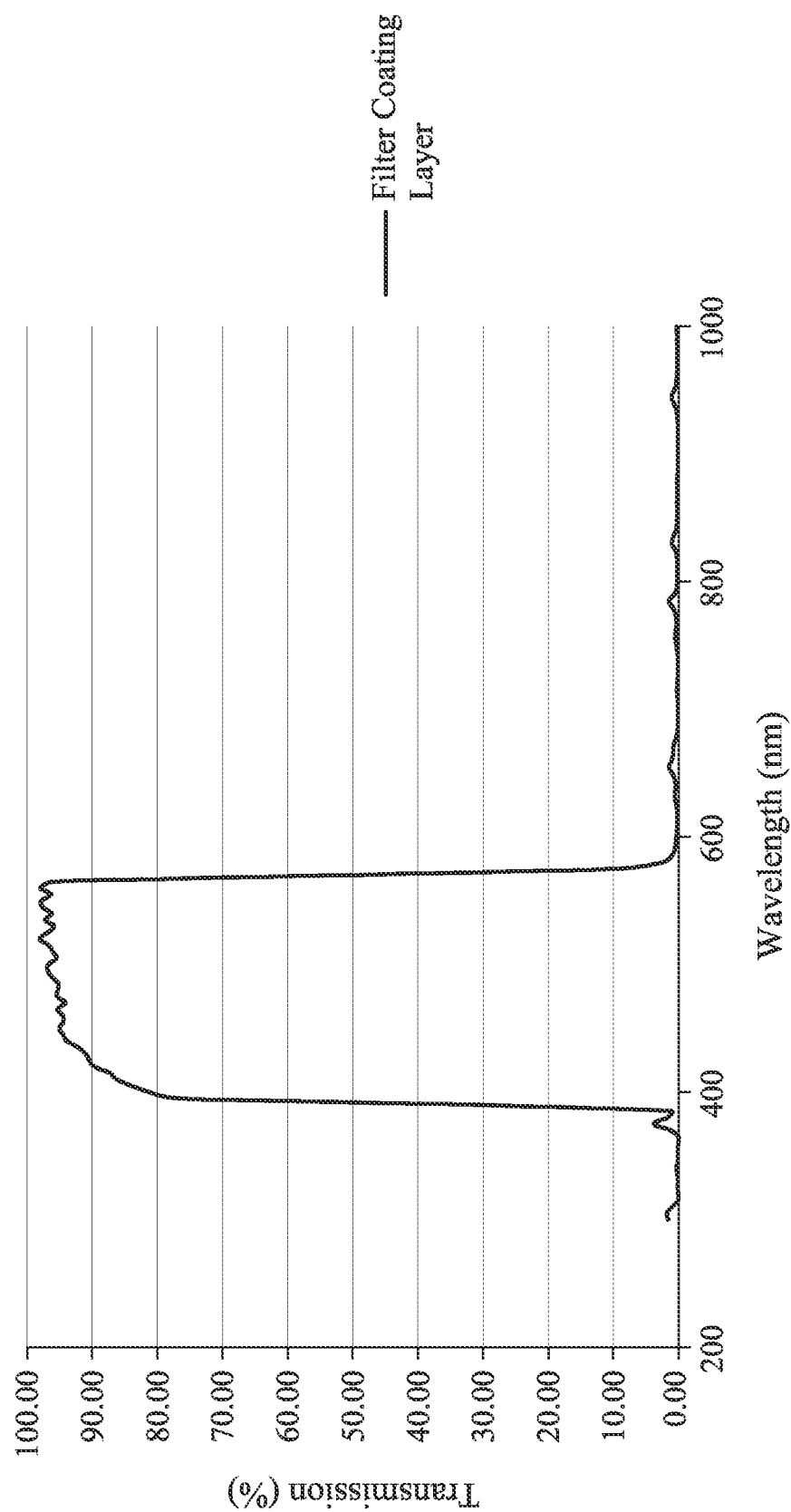
FIG. 14 is a chart showing wavelengths and transmissions of light passing through the filter coating layer of the optical fingerprint identification system according to one embodiment of the present disclosure.

The at least one filter coating layer can be a bandpass filter layer. Please refer to FIG. 14, which is a line chart showing wavelengths and transmissions of light passing through the filter coating layer of the optical fingerprint identification system according to one embodiment of the present disclosure, wherein the horizontal axis of the line chart refers to light wavelengths in nanometer (nm), and the vertical axis of the line chart refers to light transmissions in percentage (%). In the embodiment of FIG. 14, the filter coating layer is a bandpass filter layer. When light is incident on the filter coating layer, only light with a wavelength range between 400 nm and 570 nm can pass through the filter coating layer, and light with a wavelength range smaller than 400 nm or greater than 570 nm can thus be filtered.

The optical layer can further include a metalens element or a Fresnel lens element. Therefore, it is favorable for further reducing the optical path or the thickness of the array lens elements of the optical layer, such that the overall thickness of the applied electronic device can be further reduced.

Figure 11:
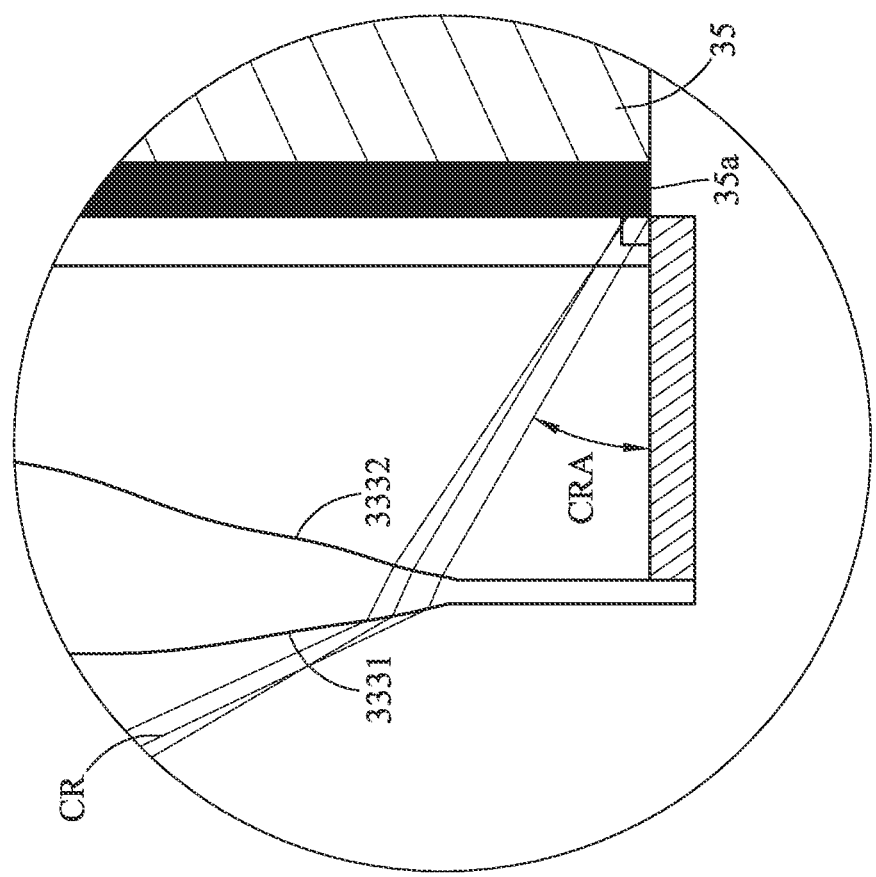
FIG. 11 is a partially enlarged view of the imaging paths of the optical fingerprint identification system of FIG. 10.

A chief ray angle at a maximum image height position of the image sensor can be smaller than 45 degrees. Therefore, it is favorable for increasing the response efficiency of the image sensor. Please refer to FIG. 11, which is a partially enlarged view of the imaging paths of the optical fingerprint identification system according to the 2nd embodiment of the present disclosure, wherein a chief ray CR is projected on the image surface 35a of the image sensor 35 at the maximum image height position, and the angle between a normal line of the image surface 35a and the chief ray CR is the chief ray angle CRA.

Figure 2:
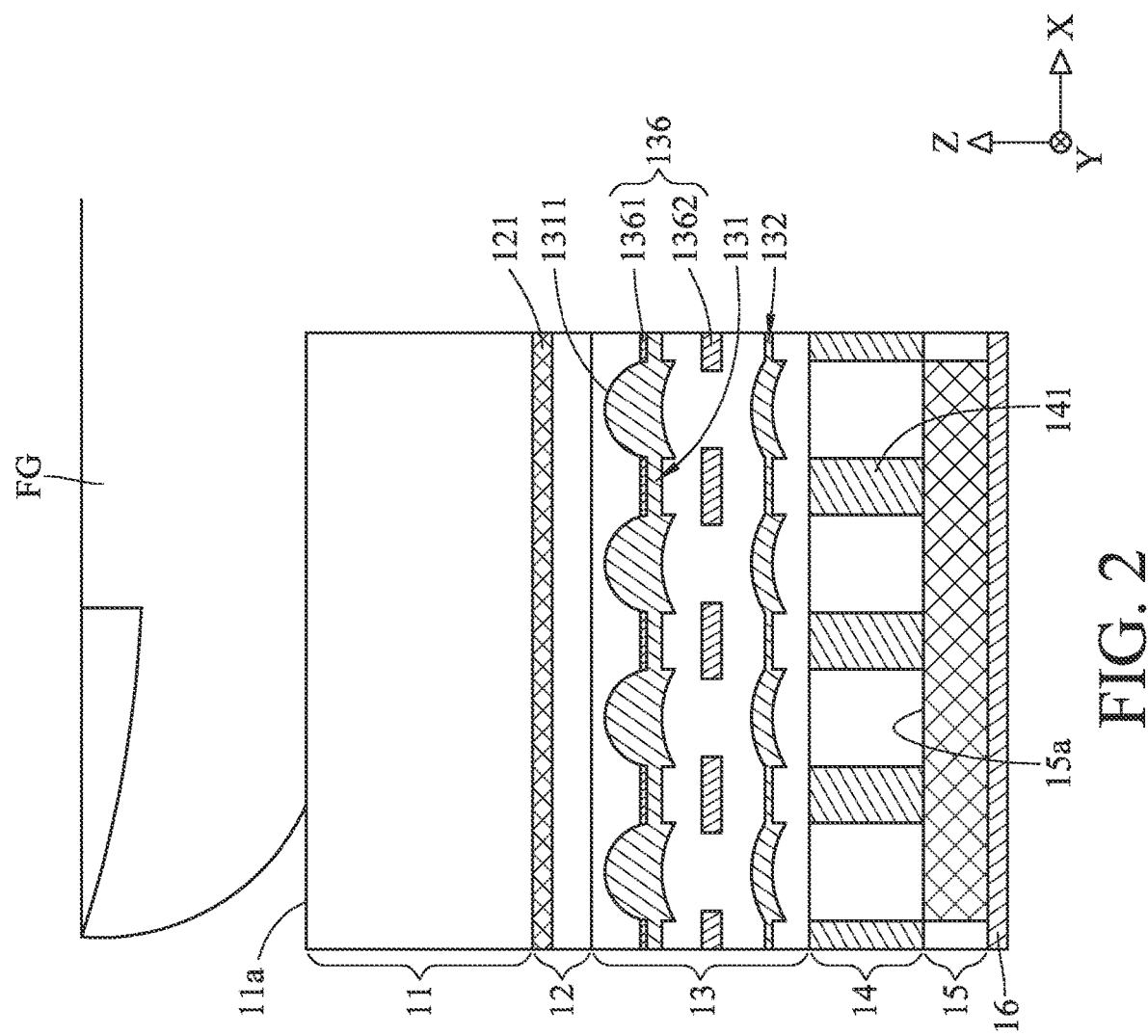
FIG. 2 is a cross-sectional view of the optical fingerprint identification system of FIG. 1.
Figure 3:
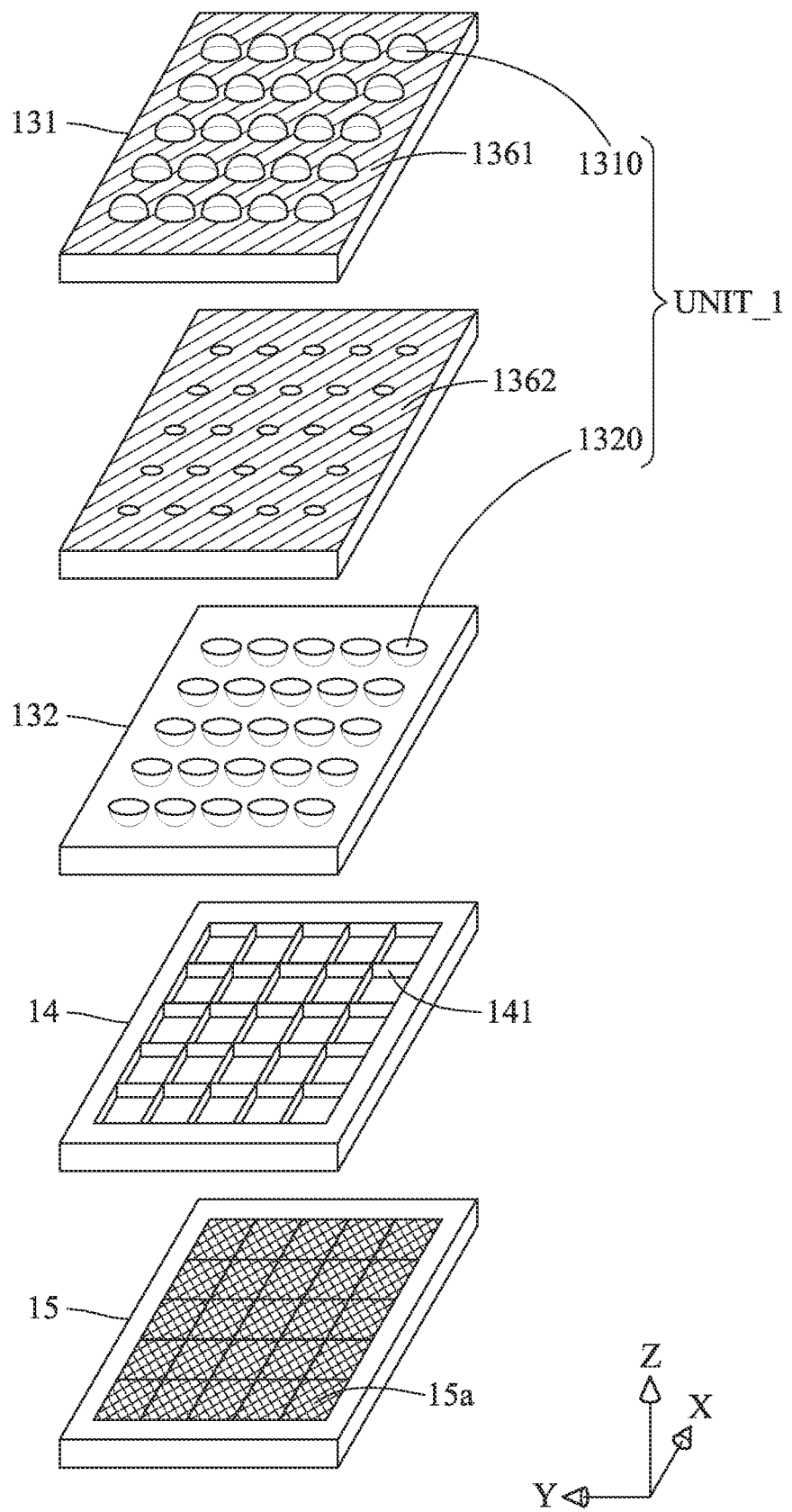
FIG. 3 is an exploded view showing the configuration of several components of the optical fingerprint identification system of FIG. 2.
Figure 4:
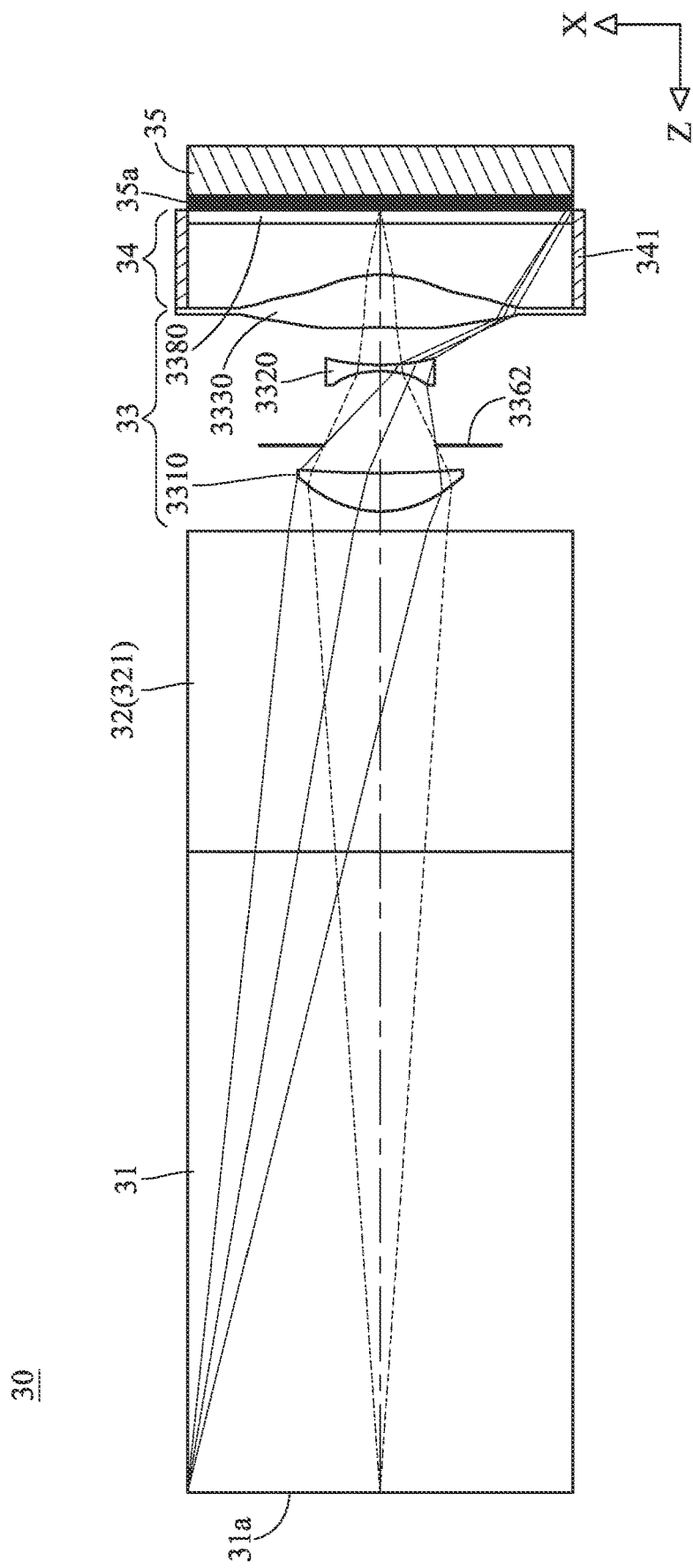
FIG. 4 is a schematic view of several components of the optical fingerprint identification system according to the 2nd embodiment of the present disclosure.
Figure 5:
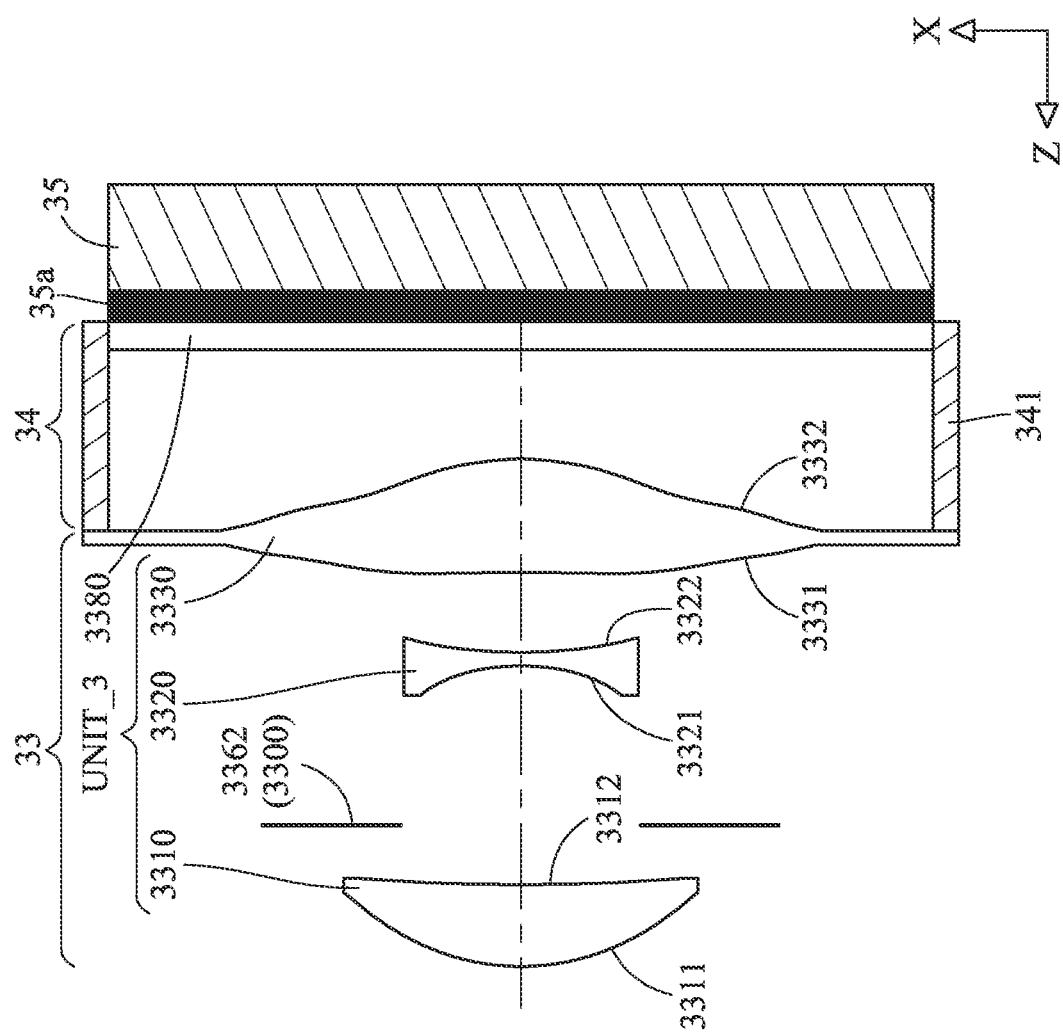
FIG. 5 is a schematic view of an imaging unit and an image sensor of the optical fingerprint identification system of FIG. 4.

According to the present disclosure, the optical fingerprint identification system can further include a collimator layer disposed above the image sensor. The collimator layer can include a lattice partition, and the lattice partition can have an inner wall made of light-absorbing material. Therefore, it is favorable for eliminating light with a large incident angle so as to prevent generating crosstalk with adjacent image sensors. Please refer to FIG. 2 and FIG. 3, wherein FIG. 2 is a cross-sectional view of the optical fingerprint identification system according to the 1st embodiment of the present disclosure, FIG. 3 is an exploded view showing the configuration of several components of the optical fingerprint identification system according to the 1st embodiment of the present disclosure, and the collimator layer 14 includes a lattice partition 141 to receive and control non-axially aligned light rays. Please also refer to FIG. 4 and FIG. 5, wherein FIG. 4 is a schematic view of several components of the optical fingerprint identification system according to the 2nd embodiment of the present disclosure, FIG. 5 is a schematic view of an imaging unit and an image sensor of the optical fingerprint identification system according to the 2nd embodiment of the present disclosure, and the collimator layer 34 includes a lattice partition 341 that forms a plurality of holes corresponding to the array lens elements of the imaging units so as to receive and control non-axially aligned light rays from the array lens elements of the imaging units.

The collimator layer can also include a light interference filter layer and a light absorption filter layer. Therefore, it is favorable for filtering light with a large incident angle and also preventing crosstalk. The light interference filter layer and the light absorption filter layer can be two filter medium layers or can be formed by coating filter medium on other light-passable element. Please refer to FIG. 15, which is a schematic view of an imaging unit and an image sensor coupled with a light interference filter layer and a light absorption filter layer of the optical fingerprint identification system according to the 9th embodiment of the present disclosure, wherein the second collimator layer 104 is plated on the filter 4380, and the light interference filter layer 1046 and the light absorption filter layer 1047 of the second collimator layer 104 can receive and control non-axially aligned light rays.

Figure 16:
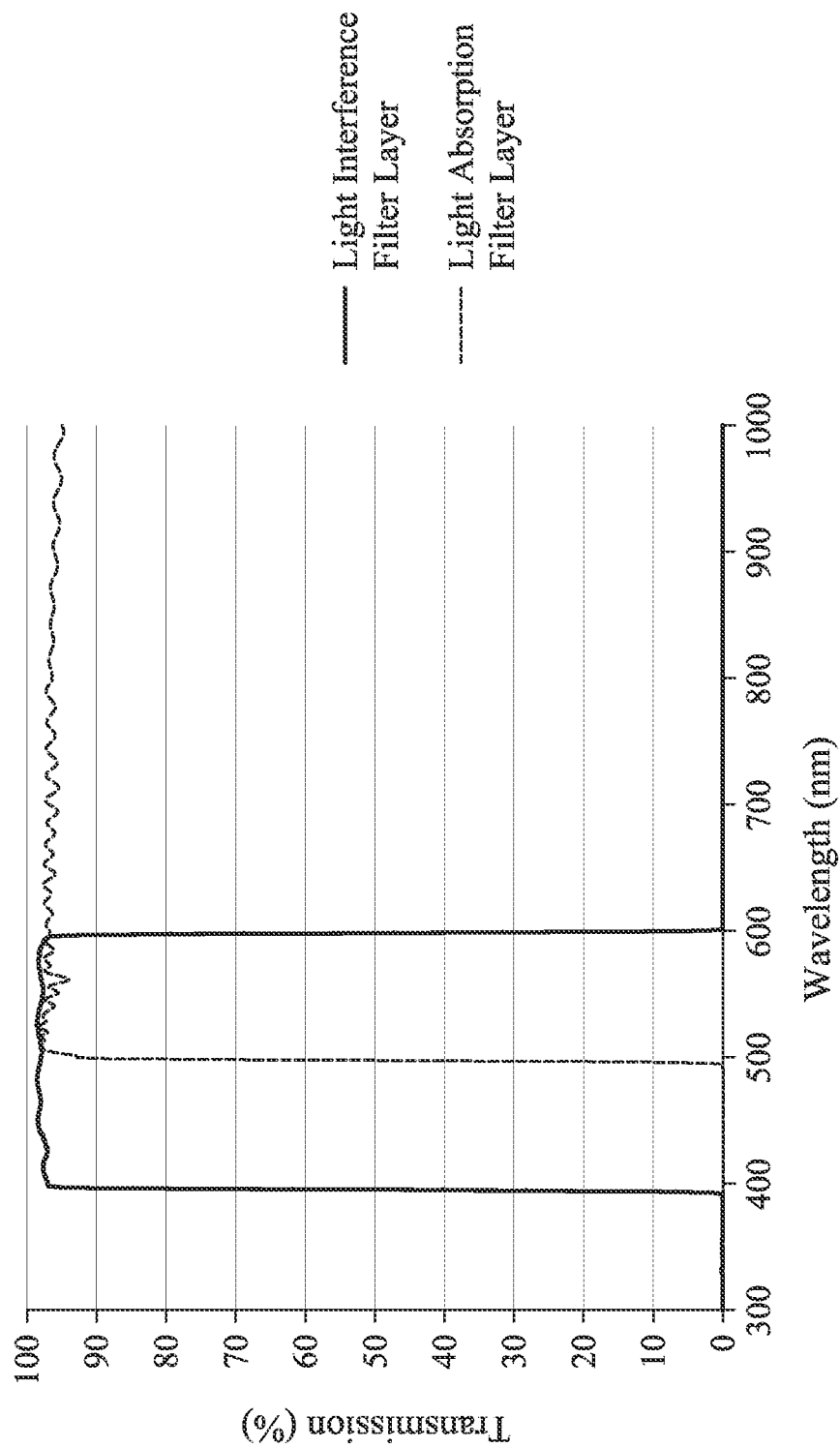
FIG. 16 is a chart showing wavelengths and transmissions of light passing through the light interference filter layer and the light absorption filter layer of the collimator layer of the optical fingerprint identification system according to one embodiment of the present disclosure.

The light interference filter layer and the light absorption filter layer can be two edgepass filter layers coupled together or two bandpass filter layers. The light interference filter layer can provide a filter bandwidth shift according to a change of an incident light angle thereon, and the light absorption filter layer can be a light passable filter layer. The combination of the light interference filter layer and the light absorption filter layer is favorable for filtering light at an overly large incident angle so as to eliminate image noises. Please refer to FIG. 16, which is a line chart showing wavelengths and transmissions of light with an incident angle closer to normal passing through the light interference filter layer and the light absorption filter layer of the collimator layer of the optical fingerprint identification system according to one embodiment of the present disclosure, wherein the horizontal axis of the line chart refers to light wavelengths in nanometer (nm), and the vertical axis of the line chart refers to light transmissions in percentage (%). In the embodiment of FIG. 16, the light interference filter layer is a bandpass filter layer, and the light absorption filter layer is an edgepass filter layer, wherein the light interference filter layer is a short pass filter layer, and the light absorption filter layer is a long pass filter layer. When light is at an incident angle closer to normal, light with a wavelength range between approximately 400 nm (the lower limit of short pass) and approximately 600 nm (the upper limit of short pass) can pass through the light interference filter layer, while light with a wavelength range above approximately 500 nm (the lower limit of long pass) can pass through the light absorption filter layer. That is, when light is at an incident angle closer to normal, light with a wavelength ranging between approximately 500 nm and approximately 600 nm can pass through the light interference filter layer and the light absorption filter layer. However, non-axially aligned light capable of passing through the light interference filter layer shifts to the left with respect to the line of FIG. 16, which is regarded as the abovementioned filter bandwidth shift. When non-axially aligned light with a specific incident angle is emitted to the collimator layer, light with a wavelength range between approximately 250 nm and approximately 450 nm, instead of the abovementioned wavelength range between approximately 400 nm and approximately 600 nm, can pass through the light interference filter layer. In this case, the specific non-axially aligned light cannot pass through the light interference filter layer and the light absorption filter layer at the same time. Therefore, it is favorable for achieving the abovementioned effect of filtering light at an overly large incident angle so as to guide incident light.

The light emitting layer can further include an organic light emitting diode (OLED) display layer. The organic light emitting diode display layer is relatively thin, and thus can have a relatively high light transmittance. Therefore, it is favorable for obtaining a sufficient amount of fingerprint reflective light so as to increase fingerprint image quality.

When an axial distance between the fingerprint contact surface and an upper surface of the first array lens element is OL, and an axial distance between the upper surface of the first array lens element and the image surface is TL, the following condition is satisfied: OL+TL<3.0 [mm]. Therefore, it is favorable for reducing the thickness of the array lens elements of the optical layer so as to be applied in a thin-type electronic device. Moreover, the following condition can also be satisfied: OL+TL<2.5 [mm]. Please refer to FIG. 10, which shows a schematic view of OL and TL according to the 2nd embodiment of the present disclosure.

When the total number of the imaging units in the optical fingerprint identification system is N, the following condition can be satisfied: 120<N<900. Therefore, it is favorable for arranging a proper number of the imaging units so as to provide a sufficient imaging range. Moreover, the following condition can also be satisfied: 150<N<650. Moreover, the following condition can also be satisfied: 150<N<450.

When an object height corresponding to each of the imaging units is YOB, and an image height corresponding to each of the imaging units is YRI, the following condition can be satisfied: |YOB/YRI|<1.5. Therefore, it is favorable for arranging a lens array stack with a thin overall thickness and good image quality. Moreover, the following condition can also be satisfied: 0.8<|YOB/YRI|<1.2. Please refer to FIG. 10, which shows a schematic view of YOB and YRI according to the 2nd embodiment of the present disclosure; YRI refers to half of a diagonal length of an effective photosensitive area of an image sensor, and YOB refers to an imaged object height corresponding to the light incident on the position of YRI.

When the axial distance between the fingerprint contact surface and the upper surface of the first array lens element is OL, and the axial distance between the upper surface of the first array lens element and the image surface is TL, the following condition can be satisfied: 2.5<OL/TL. Therefore, it is favorable for further reducing the thickness of the optical layer to be applicable in thin-type electronic devices. Moreover, the following condition can also be satisfied: 3.5<OL/TL. Moreover, the following condition can also be satisfied: 3.5<OL/TL<5.0.

When an f-number of each imaging unit in the optical fingerprint identification system is Fno, the following condition can be satisfied: 1.0<Fno<2.2. Therefore, it is favorable for providing sufficient incident light so as to optimize image quality and fingerprint identification efficiency. Moreover, the following condition can also be satisfied: 1.0<Fno<1.70.

When the axial distance between the upper surface of the first array lens element and the image surface is TL, and the image height corresponding to each of the imaging units is YRI, the following condition can be satisfied: TL/YRI<2.0. Therefore, it is favorable for obtaining a proper balance between the imaging range and the overall thickness of the optical layer. Moreover, the following condition can also be satisfied: TL/YRI<1.75.

When an Abbe number of each of the plurality of first array lens elements is V1, an Abbe number of each of the plurality of second array lens elements is V2, and an Abbe number of each of the plurality of third array lens elements is V3, the following condition can be satisfied: V1+V2+V3<100. Therefore, it is favorable for correcting chromatic aberration so as to provide additional identification functionality by using light with different color wavelengths.

When a minimum value among Abbe numbers of all array lens elements of the optical layer is Vmin, the following condition can be satisfied: Vmin<30. Therefore, it is favorable for further optimizing the chromatic aberration correction so as to increase color saturation as well as image quality. Moreover, the following condition can also be satisfied: Vmin<25.

When an average light transmittance of a wavelength range between 500 and 570 nanometers passing through the at least one filter coating layer is AvgT500, the following condition can be satisfied: AvgT500>70%. Therefore, it is favorable for increasing the total amount of visible light incident on the image sensor. When an average light transmittance of a wavelength range between 300 and 400 nanometers passing through the at least one filter coating layer is AvgT300, the following condition can be satisfied: AvgT300<30%. Therefore, it is favorable for eliminating stray light with ultraviolet wavelengths. When an average light transmittance of a wavelength range between 600 and 700 nanometers passing through the at least one filter coating layer is AvgT600, the following conditions can be satisfied: AvgT600<30%. Therefore, it is favorable for eliminating stray light with infrared wavelengths.

According to the present disclosure, the aforementioned features and conditions can be utilized in numerous combinations so as to achieve corresponding effects.

According to the present disclosure, the lens elements of the optical fingerprint identification system can be made of either glass or plastic material. When the lens elements are made of glass material, the refractive power distribution of the optical fingerprint identification system may be more flexible, and the influence on imaging caused by external environment temperature change may be reduced. The glass lens element can either be made by grinding or molding. When the lens elements are made of plastic material, the manufacturing costs can be effectively reduced. Furthermore, surfaces of each lens element can be arranged to be spherical or aspheric, wherein the former reduces manufacturing difficulty, and the latter allows more control variables for eliminating aberrations thereof, the required number of the lens elements can be reduced, and the total track length of the optical fingerprint identification system can be effectively shortened. Furthermore, the aspheric surfaces may be formed by plastic injection molding or glass molding.

According to the present disclosure, when a lens surface is aspheric, it means that the lens surface has an aspheric shape throughout its optically effective area, or a portion(s) thereof.

According to the present disclosure, one or more of the lens elements' material may optionally include an additive which alters the lens elements' transmittance in a specific range of wavelength for a reduction in unwanted stray light or color deviation. For example, the additive may optionally filter out light in the wavelength range of 600 nm to 800 nm to reduce excessive red light and/or near infrared light; or may optionally filter out light in the wavelength range of 350 nm to 450 nm to reduce excessive blue light and/or near ultraviolet light from interfering the final image. The additive may be homogeneously mixed with a plastic material to be used in manufacturing a mixed-material lens element by injection molding.

According to the present disclosure, each of an object-side surface and an image-side surface has a paraxial region and an off-axis region. The paraxial region refers to the region of the surface where light rays travel close to the optical axis, and the off-axis region refers to the region of the surface away from the paraxial region. Particularly, unless otherwise stated, when the lens element has a convex surface, it indicates that the surface is convex in the paraxial region thereof; when the lens element has a concave surface, it indicates that the surface is concave in the paraxial region thereof. Moreover, when a region of refractive power or focus of a lens element is not defined, it indicates that the region of refractive power or focus of the lens element is in the paraxial region thereof.

According to the present disclosure, an inflection point is a point on the surface of the lens element at which the surface changes from concave to convex, or vice versa. A critical point is a non-axial point of the lens surface where its tangent is perpendicular to the optical axis.

According to the present disclosure, the image surface of the optical fingerprint identification system, based on the corresponding image sensor, can be flat or curved, especially a curved surface being concave facing towards the object side of the optical fingerprint identification system.

According to the present disclosure, an image correction unit, such as a field flattener, can be optionally disposed between the lens element closest to the image side of the optical fingerprint identification system along the optical path and the image surface for correction of aberrations such as field curvature. The optical properties of the image correction unit, such as curvature, thickness, index of refraction, position and surface shape (convex or concave surface with spherical, aspheric, diffractive or Fresnel types), can be adjusted according to the design of the image capturing unit. In general, a preferable image correction unit is, for example, a thin transparent element having a concave object-side surface and a planar image-side surface, and the thin transparent element is disposed near the image surface.

According to the present disclosure, the optical fingerprint identification system can include at least one stop, such as an aperture stop, a glare stop or a field stop. Said glare stop or said field stop is set for eliminating the stray light and thereby improving image quality thereof.

According to the present disclosure, an aperture stop can be configured as a front stop or a middle stop. A front stop disposed between an imaged object and the first lens element can provide a longer distance between an exit pupil of the optical fingerprint identification system and the image surface to produce a telecentric effect, and thereby improves the image-sensing efficiency of an image sensor (for example, CCD or CMOS). A middle stop disposed between the first lens element and the image surface is favorable for enlarging the viewing angle of the optical fingerprint identification system and thereby provides a wider field of view for the same.

According to the present disclosure, the optical fingerprint identification system can include an aperture control unit. The aperture control unit may be a mechanical component or a light modulator, which can control the size and shape of the aperture through electricity or electrical signals. The mechanical component can include a movable member, such as a blade assembly or a light shielding sheet. The light modulator can include a shielding element, such as a filter, an electrochromic material or a liquid-crystal layer. The aperture control unit controls the amount of incident light or exposure time to enhance the capability of image quality adjustment. In addition, the aperture control unit can be the aperture stop of the present disclosure, which changes the f-number to obtain different image effects, such as the depth of field or lens speed.

According to the above description of the present disclosure, the following specific embodiments are provided for further explanation.

1st Embodiment

Please refer to FIG. 1 to FIG. 3, where FIG. 1 is a schematic view showing a usage scenario of an optical fingerprint identification system according to the 1st embodiment of the present disclosure, FIG. 2 is a cross-sectional view of the optical fingerprint identification system of FIG. 1, and FIG. 3 is an exploded view showing the configuration of several components of the optical fingerprint identification system of FIG. 2.

In this embodiment, an optical fingerprint identification system 10 is, for example, applied to an electronic device 1. As shown in FIG. 1, the electronic device 1 is a smartphone having a biometrics identification function. The electronic device 1 includes, in order from an inner side to an outer side thereof, a display layer (not shown) for displaying images, a touchscreen layer (not shown) for touch screen function and a transparent plate (not shown) for protection function. The electronic device 1 further includes the optical fingerprint identification system 10. The optical fingerprint identification system 10 is configured for user's finger FG to place thereon for providing fingerprint identification function. It is noted that only part of the optical fingerprint identification system 10 is illustrated in FIG. 2 for schematic purpose, and the optical fingerprint identification systems 10 and the finger FG shown in FIG. 2 may or may not reflect their actual proportion.

As shown in FIG. 2 and FIG. 3, the optical fingerprint identification system 10 includes a cover 11, a light emitting layer 12, an optical layer 13, a collimator layer 14, an image sensor 15 and a base 16, wherein the light emitting layer 12 is disposed below the cover 11 in a stack direction Z, the optical layer 13 is disposed below the light emitting layer 12 in the stack direction Z, the collimator layer 14 is disposed below the optical layer 13 in the stack direction Z, the image sensor 15 is disposed below the optical layer 13 and the collimator layer 14 in the stack direction Z, and the base 16 is disposed below the image sensor 15 in the stack direction Z. The cover 11 has a fingerprint contact surface 11a on top in the stack direction Z, and the image sensor 15 has an image surface 15a facing towards the optical layer 13.

The cover 11 can be regarded as a part of the transparent plate, and the cover 11 provides a protection function for the light emitting layer 12, the optical layer 13, the collimator layer 14, the image sensor 15 and the base 16 that are disposed below the cover 11 in the stack direction Z. The fingerprint contact surface 11a on top of the cover 11 in the stack direction Z can be used for user's fingerprint FG to place thereon.

The light emitting layer 12 is light-passable, and the light emitting layer 12 includes an organic light emitting diode display layer 121. The organic light emitting diode display layer 121 can be regarded as a part of the display layer, and the organic light emitting diode display layer 121 emits light along the stack direction Z so as to display images.

The optical layer 13 includes a first array layer 131 and a second array layer 132. The first array layer 131 is stacked on top of the second array layer 132 in the stack direction Z. The first array layer 131 includes a plurality of first array lens elements 1310 arranged at equal intervals in a first direction X and a second direction Y. The second array layer 132 includes a plurality of second array lens elements 1320 arranged at equal intervals in the first direction X and the second direction Y. The first direction X is perpendicular to the second direction Y, the first direction X and the second direction Y are perpendicular to the stack direction Z, and an xy-plane where the first direction X and the second direction Y are located is substantially parallel to the fingerprint contact surface 11a.

One of the plurality of first array lens elements 1310 and one of the plurality of second array lens elements 1320 in the optical layer 13 are coaxial along an optical axis and correspond to each other to form an imaging unit UNIT_1. The term of "correspond to each other" described herein refers to one of the plurality of first array lens elements 1310 and one of the plurality of second array lens elements 1320 respectively having orthogonal projections overlapped with each other on the base 16. In other words, the one of the plurality of first array lens elements 1310 and the one of the plurality of second array lens elements 1320 are aligned with each other in the stack direction Z.

When an axial distance between the fingerprint contact surface 11a and an upper surface 1311 of the first array lens element 1310 is OL, and an axial distance between the upper surface 1311 of the first array lens element 1310 and the image surface 15a is TL, the following condition is satisfied: OL+TL<3.0 [mm]. In this embodiment, the area of the upper surface 1311 of the first array lens element 1310 that is located closest to the light emitting layer 12 is used for defining the parameters OL and TL.

When the total number of the imaging units UNIT_1 in the optical fingerprint identification system 10 is N, the following condition is satisfied: 120<N<900.

When an object height corresponding to each of the imaging units UNIT_1 is YOB, and an image height corresponding to each of the imaging units UNIT_1 is YRI, the following condition is satisfied: |YOB/YRI|<1.5.

When the axial distance between the fingerprint contact surface 11a and the upper surface 1311 of the first array lens element 1310 is OL, and the axial distance between the upper surface 1311 of the first array lens element 1310 and the image surface 15a is TL, the following condition is satisfied: 2.5<OL/TL.

The optical layer 13 further includes a light-blocking layer 136. The light-blocking layer 136 includes a light-blocking coating layer 1361 and a light-blocking element layer 1362. The light-blocking coating layer 1361 is coated on the upper surface of the first array layer 131 in the stack direction Z. It is noted that the light-blocking coating layer 1361 is not coated on the upper surface 1311 of the first array lens elements 1310, such that light can pass through the first array lens elements 1310. The light-blocking element layer 1362 is disposed between the first array layer 131 and the second array layer 132 in the stack direction Z. It is noted that the light-blocking element layer 1362 has a plurality of openings (not numbered) located between the first array lens elements 1310 and the second array lens elements 1320 and respectively aligned with the second array lens elements 1320 in the stack direction Z, such that light can pass through the second array lens elements 1320.

The collimator layer 14 includes a lattice partition 141, and the lattice partition 141 has inner walls made of light-absorbing material. It is noted that the lattice partition 141 forms a plurality of holes (not numbered) aligned with the first array lens elements 1310 and the second array lens elements 1320 in the stack direction Z, such that light can pass through the collimator layer 14.

When user's finger FG is placed on the fingerprint contact surface 11a of the cover 11, the organic light emitting diode display layer 121 or another light source (not shown) can emit a sensing light (not shown) towards the finger FG. The sensing light can be reflected off the finger FG and then sequentially passing through the cover 11, the light emitting layer 12, the first array lens elements 1310, the openings of the light-blocking element layer 1362 and the second array lens elements 1320 of the optical layer 13. The sensing light passing through the optical layer 13 can be guided by the collimator layer 14 to provide an incident angle closer to normal (not shown) towards the image sensor 15 on the base 16. The light at the incident angle closer to normal can image on the image surface 15a of the image sensor 15 to generate optical signals, the optical signals can be converted to electrical signals by the image sensor 15, and the electrical signals can be transmitted to a processor (not shown). Electrical signals generated by light passing through several imaging units UNIT_1 would be collected to form an image for the processor to perform an identification process.

2nd Embodiment

Please refer to FIG. 4, which is a schematic view of several components of the optical fingerprint identification system according to the 2nd embodiment of the present disclosure.

As shown in FIG. 4, the optical fingerprint identification system 30 includes a cover 31, a light emitting layer 32, an optical layer 33, a collimator layer 34, an image sensor 35 and a base (not shown), wherein the light emitting layer 32 is disposed below the cover 31 in a stack direction Z (i.e. the right side of FIG. 4, or the negative Z direction), the optical layer 33 is disposed below the light emitting layer 32 in the stack direction Z, the collimator layer 34 is disposed below part of the optical layer 33 in the stack direction Z, the image sensor 35 is disposed below the optical layer 33 and the collimator layer 34 in the stack direction Z, and the base is disposed below the image sensor 35 in the stack direction Z. The cover 31 has a fingerprint contact surface 31a on top in the stack direction Z (i.e. the left side of FIG. 4, or the positive Z direction), and the image sensor 35 has an image surface 35a facing towards the optical layer 33.

The cover 31 is made of glass material, and the cover 31 provides a protection function for the light emitting layer 32, the optical layer 33, the collimator layer 34, the image sensor 35 and the base that are disposed below the cover 31 in the stack direction Z. The fingerprint contact surface 31a on top of the cover 31 in the stack direction Z can be used for user's fingerprint FG to place thereon.

The light emitting layer 32 is light-passable, and the light emitting layer 32 includes an organic light emitting diode display layer 321. The organic light emitting diode display layer 321 emits light along the stack direction Z so as to display images.

Please further refer to FIG. 5 to describe the optical layer 33 and the image sensor 35 in detail, wherein FIG. 5 is a schematic view of an imaging unit and an image sensor of the optical fingerprint identification system of FIG. 4.

The optical layer 33 includes a first array layer (not numbered), a second array layer (not numbered) and a third array layer (not numbered). The first array layer is stacked on top of the second array layer in the stack direction Z. The second array layer is stacked on top of the third array layer in the stack direction Z. The first array layer includes a plurality of first array lens elements 3310 arranged at equal intervals in a first direction X. The second array layer includes a plurality of second array lens elements 3320 arranged at equal intervals in the first direction X. The third array layer includes a plurality of third array lens elements 3330 arranged at equal intervals in the first direction X. For simplicity, only one first array lens element 3310, one second array lens element 3320 and one third array lens element 3330 are illustrated in FIG. 4 and FIG. 5.

One first array lens element 3310, one second array lens element 3320 and one third array lens element 3330 in the optical layer 33 are coaxial along an optical axis and correspond to one another to form an imaging unit UNIT_3. The term of "correspond to one another" described herein refers to one first array lens element 3310, one second array lens element 3320 and one third array lens element 3330 having orthogonal projections overlapped with one another on the base. In other words, the one first array lens element 3310, the one second array lens element 3320 and the one third array lens element 3330 are aligned with one another in the stack direction Z.

The first array lens element 3310 with positive refractive power has an upper surface 3311 being convex in a paraxial region thereof and a lower surface 3312 being concave in a paraxial region thereof. The first array lens element 3310 is made of glass material and has the upper surface 3311 and the lower surface 3312 being both aspheric.

The second array lens element 3320 with negative refractive power has an upper surface 3321 being concave in a paraxial region thereof and a lower surface 3322 being concave in a paraxial region thereof. The second array lens element 3320 is made of glass material and has the upper surface 3321 and the lower surface 3322 being both aspheric.

The third array lens element 3330 with positive refractive power has an upper surface 3331 being concave in a paraxial region thereof and a lower surface 3332 being convex in a paraxial region thereof. The third array lens element 3330 is made of glass material and has the upper surface 3331 and the lower surface 3332 being both aspheric. The upper surface 3331 of the third array lens element 3330 has at least one inflection point. The lower surface 3332 of the third array lens element 3330 has at least one inflection point. The upper surface 3331 of the third array lens element 3330 has at least one critical point in an off-axis region thereof.

The optical layer 33 further includes a light-blocking layer (not numbered). The light-blocking layer includes a light-blocking element layer 3362. The light-blocking element layer 3362 is disposed between the first array layer and the second array layer in the stack direction Z. It is noted that the light-blocking element layer 3362 has an opening (not numbered) located between the first array lens element 3310 and the second array lens element 3320 and aligned with the second array lens element 3320 in the stack direction Z, such that light can pass through the second array lens element 3320 and the third array lens element 3330. In addition, an area of the light-blocking element layer 3362 surrounding the opening thereof can be regarded as an aperture stop 3300 disposed between the first array lens element 3310 and the second array lens element 3320.

The optical layer 33 further includes a filter 3380 made of glass material. The filter 3380 is disposed at the lower part of the collimator layer 34 in the stack direction Z and located between the third array lens element 3330 of the optical layer 33 and the image sensor 35, and will not affect the focal length of the optical fingerprint identification system 30.

The collimator layer 34 includes a lattice partition 341, and the lattice partition 341 has inner walls made of light-absorbing material. It is noted that the lattice partition 341 forms a hole (not numbered) aligned with the first array lens element 3310, the second array lens element 3320 and the third array lens element 3330 in the stack direction Z, such that light can pass through the collimator layer 34. The filter 3380 is located in the hole formed by the lattice partition 341 of the collimator layer 34.

When user's finger is placed on the fingerprint contact surface 31a of the cover 31, the organic light emitting diode display layer 321 or another light source (not shown) can emit a sensing light towards the finger. The sensing light can be reflected off the finger and then sequentially passing through the cover 31, the light emitting layer 32, the first array lens element 3310, the aperture stop 3300, the second array lens element 3320 and the third array lens element 3330 of the optical layer 33 and the filter 3380. The sensing light passing through the optical layer 33 can be guided by the collimator layer 34 to provide an incident angle closer to normal towards the image sensor 35 on the base. The light at the incident angle closer to normal can image on the image surface 35a of the image sensor 35 to generate optical signals, the optical signals can be converted to electrical signals by the image sensor 35, and the electrical signals can be transmitted to a processor (not shown). Electrical signals generated by light passing through several imaging units UNIT_3 would be collected to form an image for the processor to perform an identification process.

The equation of the aspheric surface profiles of the aforementioned array lens elements of the 2nd embodiment is expressed as follows:

$$X(Y) = (Y^2/R)/(1 + sqrt(1 - (1+k) \times (Y/R)^2)) + \sum_i (Ai) \times (Y^i),$$

where,

X is the displacement in parallel with the optical axis from the intersection point of the aspheric surface and the optical axis to a point at a distance of Y from the optical axis on the aspheric surface;

Y is the vertical distance from the point on the aspheric surface to the optical axis;

R is the curvature radius;

k is the conic coefficient; and

Ai is the i-th aspheric coefficient, and in the embodiments, i may be, but is not limited to, 4, 6, 8, 10, 12 and 14.

In the optical fingerprint identification system 30 according to the 2nd embodiment, when a focal length of the optical fingerprint identification system 30 is f, an f-number of each imaging unit UNIT_3 in the optical fingerprint identification system 30 is Fno, and half of a maximum field of view of the optical fingerprint identification system 30 is HFOV, these parameters have the following values: f=0.86 millimeters (mm), Fno=1.65, HFOV=14.95 degrees (deg.).

When the total number of the imaging units UNIT_3 in the optical fingerprint identification system 30 is N, the following condition is satisfied: N=324.

When the number of rows of a matrix formed by the imaging units UNIT_3 in the optical fingerprint identification system 30 is m, and the number of columns of the matrix formed by the imaging units UNIT_3 in the optical fingerprint identification system 30 is n (i.e., the imaging units UNIT_3 form an m×n matrix), the following conditions are satisfied: m=18; and n=18.

When an axial distance between the fingerprint contact surface 31a and the upper surface 3311 of the first array lens element 3310 is OL, and an axial distance between the upper surface 3311 of the first array lens element 3310 and the image surface 35a is TL, the following condition is satisfied: OL+TL=2.0 [mm]. In this embodiment, the area of the upper surface 3311 of the first array lens element 3310 that located closest to the light emitting layer 32 is used for defining the parameters OL and TL.

When an object height corresponding to each of the imaging units UNIT_3 is YOB, and an image height corresponding to each of the imaging units UNIT_3 is YRI, the following condition is satisfied: |YOB/YRI|=1.0.

When the axial distance between the fingerprint contact surface 31a and the upper surface 3311 of the first array lens element 3310 is OL, and the axial distance between the upper surface 3311 of the first array lens element 3310 and the image surface 35a is TL, the following condition is satisfied: OL/TL=3.59.

When the axial distance between the upper surface 3311 of the first array lens element 3310 and the image surface 35a is TL, and the image height corresponding to each of the imaging units UNIT_3 is YRI, the following condition is satisfied: TL/YRI=1.57.

When a minimum value among Abbe numbers of all array lens elements of the optical layer 33 is Vmin, the following condition is satisfied: Vmin=23.7. In this embodiment, among the first array lens elements 3310, the second array lens elements 3320 and the third array lens element 3330, an Abbe number of the second array lens elements 3320 is smaller than Abbe numbers of the other array lens elements, and Vmin is equal to the Abbe number of the second array lens elements 3320.

When an Abbe number of the first array lens elements 3310 is V1, the Abbe number of the second array lens elements 3320 is V2, and an Abbe number of the third array lens element 3330 is V3, the following condition is satisfied: V1+V2+V3=96.9.

When a chief ray angle at a maximum image height position of the image sensor 35 (half of a diagonal length of an effective photosensitive area of the image sensor 35) is CRA, the following condition is satisfied: CRA=30.0 [deg.].

In this embodiment, the optical layer 33 further includes a filter coating layer (not shown) coated on at least one of the upper surface and the lower surface of at least one of the first array lens elements 3310, the second array lens elements 3320 and the third array lens element 3330 of the optical layer 33. The filter coating layer will not affect the focal length of the optical fingerprint identification system 30. When an average light transmittance of a wavelength range between 500 and 570 nanometers passing through the at least one filter coating layer is AvgT500, an average light transmittance of a wavelength range between 300 and 400 nanometers passing through the at least one filter coating layer is AvgT300, and an average light transmittance of a wavelength range between 600 and 700 nanometers passing through the at least one filter coating layer is AvgT600, the following conditions are satisfied: AvgT500=97.77%; AvgT300=0.06%; and AvgT600=0.97%.

The detailed optical data of the 2nd embodiment are shown in Table 1 and the aspheric surface data are shown in Table 2 below.

TABLE 1

2nd Embodiment
f = 0.86 mm, Fno = 1.65, HFOV = 14.95 deg.

| Surface # | | Curvature Radius | | Thickness | Material | Index | Abbe # | Focal Length |
|---|---|---|---|---|---|---|---|---|
| 0 | Object | Plano | | 0 | | | | |
| 1 | Cover | Plano | | 1.500 | Glass | 1.517 | 64.2 | — |
| 2 | Light emitting layer | Plano | | 0.189 | | | | |
| 3 | | Plano | | −0.159 | | | | |
| 4 | 1st array lens element | 0.170 | (ASP) | 0.060 | Glass | 1.811 | 39.5 | 0.23 |
| 5 | | 1.948 | (ASP) | 0.043 | | | | |
| 6 | Light-blocking layer (Ape. Stop) | Plano | | 0.116 | | | | |
| 7 | 2nd array lens element | −0.153 | (ASP) | 0.010 | Glass | 1.847 | 23.7 | −0.13 |
| 8 | | 0.388 | (ASP) | 0.058 | | | | |
| 9 | 3rd array lens element | −1.311 | (ASP) | 0.083 | Glass | 1.664 | 33.7 | 0.12 |
| 10 | | −0.074 | (ASP) | 0.000 | | | | |
| 11 | Collimator layer | Plano | | 0.080 | | | | |
| 12 | Filter | Plano | | 0.020 | Glass | 1.517 | 64.2 | — |
| 13 | Image sensor | Plano | | — | | | | |

Note:
Reference wavelength is 550 nm.

TABLE 2

Aspheric Coefficients

| Surface # | 4 | 5 | 7 | 8 | 9 | 10 |
|---|---|---|---|---|---|---|
| k = | −7.2791E−01 | −4.6747E+01 | −6.7882E+01 | −6.7011E+01 | −8.2742E+01 | −9.9000E+01 |
| A4 = | 2.2607E+01 | 1.4989E+01 | −1.0564E+03 | 1.3220E+02 | 2.3067E+01 | −3.8031E+02 |
| A6 = | −2.6748E+03 | −2.4073E+03 | 2.2879E+05 | −1.7686E+04 | 4.0963E+03 | 3.7666E+04 |
| A8 = | 3.1314E+05 | 3.6044E+05 | −3.2775E+07 | 2.9957E+06 | −3.1483E+05 | −1.6168E+06 |
| A10 = | −1.3249E+07 | −2.4894E+07 | 1.8969E+09 | −2.4137E+08 | 8.6515E+06 | 3.4690E+07 |
| A12 = | 9.8702E+07 | 5.5054E+08 | −3.5479E+10 | 5.1657E+09 | −1.0348E+08 | −3.6049E+08 |
| A14 = | — | — | — | — | 4.4307E+08 | 1.4173E+09 |

In Table 1, the curvature radius, the thickness and the focal length are shown in millimeters (mm). Surface numbers 0-13 represent the surfaces sequentially arranged from the upper side to the lower side along the optical axis. In Table 2, k represents the conic coefficient of the equation of the aspheric surface profiles. A4-A14 represent the aspheric coefficients ranging from the 4th order to the 14th order. The tables presented below for each embodiment are the corresponding schematic parameter and aberration curves, and the definitions of the tables are the same as Table 1 and Table 2 of the 2nd embodiment. Therefore, an explanation in this regard will not be provided again.

3rd Embodiment

Figure 6:
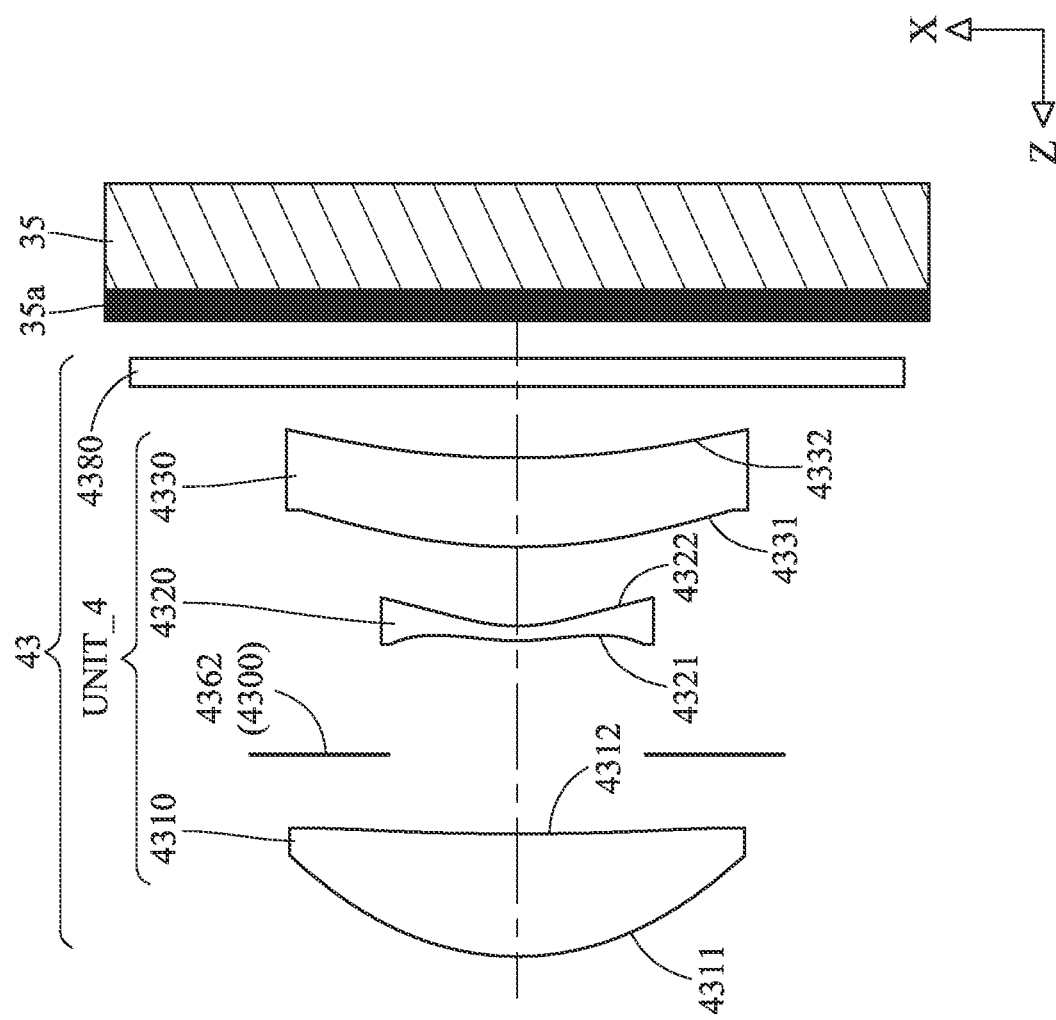
FIG. 6 is a schematic view of an imaging unit and an image sensor of the optical fingerprint identification system according to the 3rd embodiment of the present disclosure.

Please refer to FIG. 6, which is a schematic view of an imaging unit and an image sensor of the optical fingerprint identification system according to the 3rd embodiment of the present disclosure.

In this embodiment, the optical fingerprint identification system (not numbered) includes, in order from top to bottom in a stack direction Z, a cover (not shown), a light emitting layer (not shown), an optical layer 43, a collimator layer (not shown), an image sensor 35 and a base (not shown), wherein the structures of the cover, the light emitting layer, the collimator layer and the base are respectively similar to the structures of the cover 31, the light emitting layer 32, the collimator layer 34 and the base of the 2nd embodiment, and a description in this regard will not be provided again. Also, for simplicity, the cover, the light emitting layer, the collimator layer and the base are not illustrated in FIG. 6. In addition, the image sensor 35 and an image surface 35a shown in FIG. 6 are respectively the same as the elements with the same reference numbers in the 2nd embodiment. Hereinafter, only elements in the figure of this embodiment with different reference numbers from that of the 2nd embodiment would be described.

The optical layer 43 includes a first array layer (not numbered), a second array layer (not numbered) and a third array layer (not numbered). The first array layer is stacked on top of the second array layer in the stack direction Z. The second array layer is stacked on top of the third array layer in the stack direction Z. The first array layer includes a plurality of first array lens elements 4310 arranged at equal intervals in a first direction X. The second array layer includes a plurality of second array lens elements 4320 arranged at equal intervals in the first direction X. The third array layer includes a plurality of third array lens elements 4330 arranged at equal intervals in the first direction X. For simplicity, only one first array lens element 4310, one second array lens element 4320 and one third array lens element 4330 are illustrated in FIG. 6.

One first array lens element 4310, one second array lens element 4320 and one third array lens element 4330 in the optical layer 43 are coaxial along an optical axis and correspond to one another to form an imaging unit UNIT_4. The term of "correspond to one another" described herein refers to one first array lens element 4310, one second array lens element 4320 and one third array lens element 4330 having orthogonal projections overlapped with one another on the base. In other words, the one first array lens element 4310, the one second array lens element 4320 and the one third array lens element 4330 are aligned with one another in the stack direction Z.

The first array lens element 4310 with positive refractive power has an upper surface 4311 being convex in a paraxial region thereof and a lower surface 4312 being concave in a paraxial region thereof. The first array lens element 4310 is made of glass material and has the upper surface 4311 and the lower surface 4312 being both aspheric.

The second array lens element 4320 with negative refractive power has an upper surface 4321 being convex in a paraxial region thereof and a lower surface 4322 being concave in a paraxial region thereof. The second array lens element 4320 is made of glass material and has the upper surface 4321 and the lower surface 4322 being both aspheric. The upper surface 4321 of the second array lens element 4320 has at least one inflection point. The lower surface 4322 of the second array lens element 4320 has at least one inflection point. The upper surface 4321 of the second array lens element 4320 has at least one critical point in an off-axis region thereof.

The third array lens element 4330 with positive refractive power has an upper surface 4331 being convex in a paraxial region thereof and a lower surface 4332 being concave in a paraxial region thereof. The third array lens element 4330 is made of glass material and has the upper surface 4331 and the lower surface 4332 being both aspheric. The lower surface 4332 of the third array lens element 4330 has at least one inflection point.

The optical layer 43 further includes a light-blocking layer (not numbered). The light-blocking layer includes a light-blocking element layer 4362. The light-blocking element layer 4362 is disposed between the first array layer and the second array layer in the stack direction Z. It is noted that the light-blocking element layer 4362 has an opening (not numbered) located between the first array lens element 4310 and the second array lens element 4320 and aligned with the second array lens element 4320 in the stack direction Z, such that light can pass through the second array lens element 4320 and the third array lens element 4330. In addition, an area of the light-blocking element layer 4362 surrounding the opening thereof can be regarded as an aperture stop 4300 disposed between the first array lens element 4310 and the second array lens element 4320.

The optical layer 43 further includes a filter 4380 made of glass material. The filter 4380 is disposed between the third array lens element 4330 of the optical layer 43 and the image sensor 35, and will not affect the focal length of the optical fingerprint identification system.

When user's finger is placed on the fingerprint contact surface of the cover, an organic light emitting diode display layer of the light emitting layer or another light source (not shown) can emit a sensing light towards the finger. The sensing light can be reflected off the finger and then sequentially passing through the cover, the light emitting layer, the first array lens element 4310, the aperture stop 4300, the second array lens element 4320 and the third array lens element 4330 of the optical layer 43 and the filter 4380 to emit towards the image sensor 35 on the base. The sensing light passing through the optical layer 43 can image on the image surface 35a of the image sensor 35 to generate optical signals, the optical signals can be converted to electrical signals by the image sensor 35, and the electrical signals can be transmitted to a processor (not shown). Electrical signals generated by light passing through several imaging units UNIT_4 would be collected to form an image for the processor to perform an identification process.

The detailed optical data of the 3rd embodiment are shown in Table 3 and the aspheric surface data are shown in Table 4 below.

Moreover, these parameters can be calculated from Table 3 and Table 4 as the following values and satisfy the following conditions:

| 3rd Embodiment | | | |
|---|---|---|---|
| f [mm] | 0.27 | OL/TL | 3.85 |
| Fno | 1.65 | TL/YRI | 1.16 |
| HFOV [deg.] | 18.4 | Vmin | 23.7 |
| N | 196 | V1 + V2 + V3 | 77.9 |
| m (row) | 14 | CRA [deg.] | 42.7 |
| n (column) | 14 | AvgT500 [%] | 97.77 |
| OL + TL [mm] | 1.993 | AvgT300 [%] | 0.06 |
| |YOB/YRI| | 1.0 | AvgT600 [%] | 0.97 |

4th Embodiment

Figure 7:
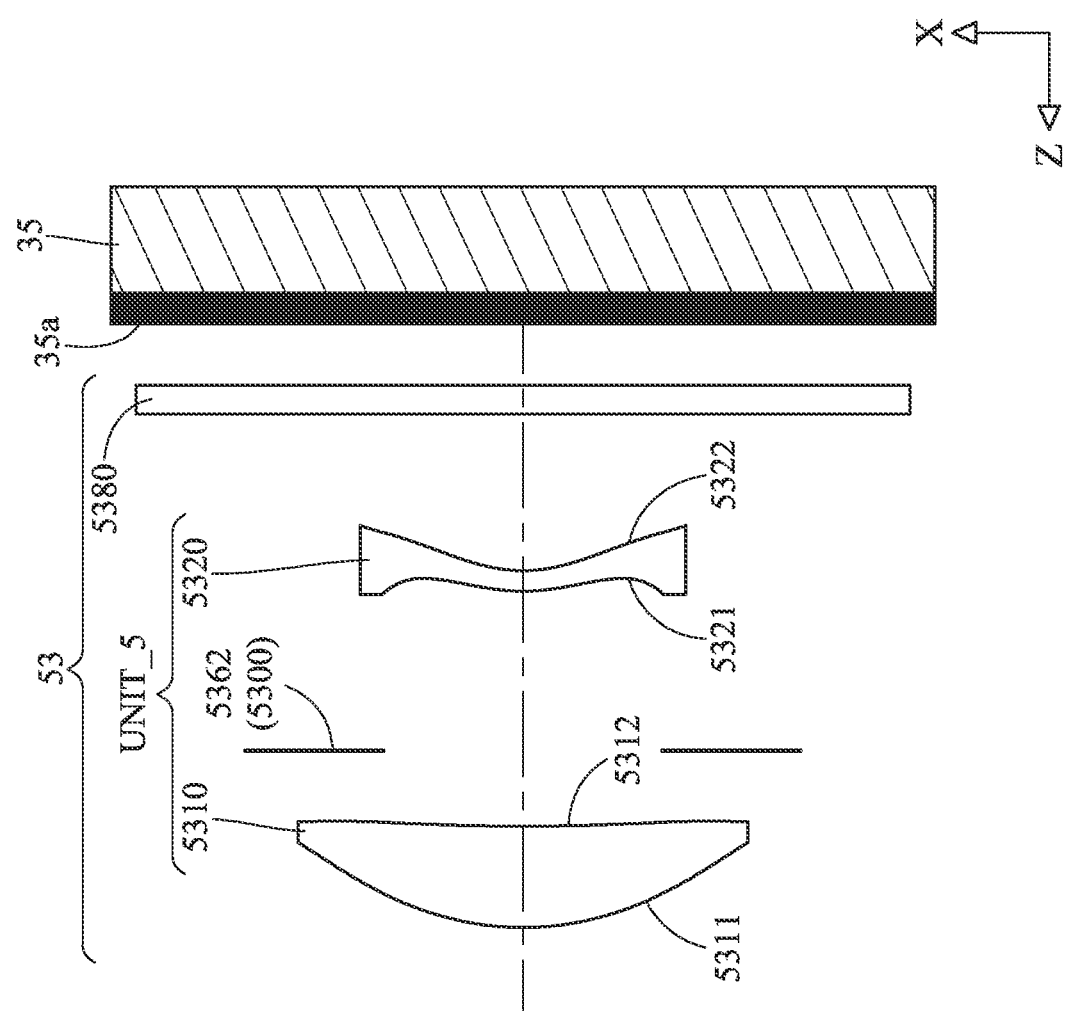
FIG. 7 is a schematic view of an imaging unit and an image sensor of the optical fingerprint identification system according to the 4th embodiment of the present disclosure.

Please refer to FIG. 7, which is a schematic view of an imaging unit and an image sensor of the optical fingerprint identification system according to the 4th embodiment of the present disclosure.

In this embodiment, the optical fingerprint identification system (not numbered) includes, in order from top to bottom

TABLE 3

3rd Embodiment
f = 0.27 mm, Fno = 1.65, HFOV = 18.36 deg.

| Surface # | | Curvature Radius | | Thickness | Material | Index | Abbe # | Focal Length |
|---|---|---|---|---|---|---|---|---|
| 0 | Object | Plano | | 0 | | | | |
| 1 | Cover | Plano | | 1.500 | Glass | 1.517 | 64.2 | — |
| 2 | Light emitting layer | Plano | | 0.284 | | | | |
| 3 | | Plano | | −0.254 | | | | |
| 4 | 1st array lens element | 0.201 | (ASP) | 0.089 | Glass | 1.828 | 30.1 | 0.26 |
| 5 | | 2.332 | (ASP) | 0.058 | | | | |
| 6 | Light-blocking layer (Ape. Stop) | Plano | | 0.083 | | | | |
| 7 | 2nd array lens element | 0.181 | (ASP) | 0.011 | Glass | 1.832 | 24.1 | −0.50 |
| 8 | | 0.123 | (ASP) | 0.058 | | | | |
| 9 | 3rd array lens element | 0.419 | (ASP) | 0.065 | Glass | 1.847 | 23.7 | 1.11 |
| 10 | | 0.700 | (ASP) | 0.000 | | | | |
| 11 | Collimator layer | Plano | | 0.082 | | | | |
| 12 | Filter | Plano | | 0.018 | Glass | 1.517 | 64.2 | — |
| 13 | Image sensor | Plano | | — | | | | |

Note:
Reference wavelength is 550 nm.

TABLE 4

| Aspheric Coefficients | | | | | | |
|---|---|---|---|---|---|---|
| Surface # | 4 | 5 | 7 | 8 | 9 | 10 |
| k = | −9.6478E−01 | −9.8900E+01 | −6.0017E+01 | −7.3308E−01 | −9.5641E−02 | 2.4846E+00 |
| A4 = | 9.1754E+00 | 5.7428E+00 | 6.2500E+01 | −4.0668E+02 | −3.2858E+00 | 8.3693E+00 |
| A6 = | −9.1952E+01 | −2.2089E+02 | −6.8984E+04 | 2.8656E+04 | −1.2321E+02 | −4.4974E+02 |
| A8 = | 1.9085E+04 | −1.2029E+04 | 8.2905E+06 | −1.2865E+06 | 7.7146E+02 | 4.6348E+03 |
| A10 = | −1.2391E+06 | 5.5954E+05 | −4.6205E+08 | 3.7896E+07 | −1.0019E+03 | −1.6865E+04 |
| A12 = | 1.9407E+07 | −5.5987E+06 | 7.9065E+09 | −5.0313E+08 | — | — |

In the 3rd embodiment, the equation of the aspheric surface profiles of the aforementioned lens elements is the same as the equation of the 2nd embodiment. Also, the definitions of these parameters shown in the following table are the same as those stated in the 2nd embodiment with corresponding values for the 3rd embodiment, so an explanation in this regard will not be provided again.

in a stack direction Z, a cover (not shown), a light emitting layer (not shown), an optical layer 53, a collimator layer (not shown), an image sensor 35 and a base (not shown), wherein the structures of the cover, the light emitting layer, the collimator layer and the base are respectively similar to the structures of the cover 31, the light emitting layer 32, the collimator layer 34 and the base of the 2nd embodiment, and a description in this regard will not be provided again. Also, for simplicity, the cover, the light emitting layer, the collimator layer and the base are not illustrated in FIG. 7. In addition, the image sensor 35 and an image surface 35a shown in FIG. 7 are respectively the same as the elements with the same reference numbers in the 2nd embodiment. Hereinafter, only elements in the figure of this embodiment with different reference numbers from that of the above embodiments would be described.

The optical layer 53 includes a first array layer (not numbered) and a second array layer (not numbered). The first array layer is stacked on top of the second array layer in the stack direction Z. The first array layer includes a plurality of first array lens elements 5310 arranged at equal intervals in a first direction X. The second array layer includes a plurality of second array lens elements 5320 arranged at equal intervals in the first direction X. For simplicity, only one first array lens element 5310 and one second array lens element 5320 are illustrated in FIG. 7.

One first array lens element 5310 and one second array lens element 5320 in the optical layer 53 are coaxial along an optical axis and correspond to each other to form an imaging unit UNIT_5. The term of "correspond to each other" described herein refers to one first array lens element 5310 and one second array lens element 5320 having orthogonal projections overlapped with each other on the base. In other words, the one first array lens element 5310 and the one second array lens element 5320 are aligned with each other in the stack direction Z.

The first array lens element 5310 with positive refractive power has an upper surface 5311 being convex in a paraxial region thereof and a lower surface 5312 being concave in a paraxial region thereof. The first array lens element 5310 is made of glass material and has the upper surface 5311 and the lower surface 5312 being both aspheric. The upper surface 5311 of the first array lens element 5310 has at least one inflection point. The lower surface 5312 of the first array lens element 5310 has at least one inflection point. The lower surface 5312 of the first array lens element 5310 has at least one critical point in an off-axis region thereof.

The second array lens element 5320 with negative refractive power has an upper surface 5321 being convex in a paraxial region thereof and a lower surface 5322 being concave in a paraxial region thereof. The second array lens element 5320 is made of glass material and has the upper surface 5321 and the lower surface 5322 being both aspheric. The upper surface 5321 of the second array lens element 5320 has at least one inflection point. The lower surface 5322 of the second array lens element 5320 has at least one inflection point. The upper surface 5321 of the second array lens element 5320 has at least one critical point in an off-axis region thereof.

The optical layer 53 further includes a light-blocking layer (not numbered). The light-blocking layer includes a light-blocking element layer 5362. The light-blocking element layer 5362 is disposed between the first array layer and the second array layer in the stack direction Z. It is noted that the light-blocking element layer 5362 has an opening (not numbered) located between the first array lens element 5310 and the second array lens element 5320 and aligned with the second array lens element 5320 in the stack direction Z, such that light can pass through the second array lens element 5320. In addition, an area of the light-blocking element layer 5362 surrounding the opening thereof can be regarded as an aperture stop 5300 disposed between the first array lens element 5310 and the second array lens element 5320.

The optical layer 53 further includes a filter 5380 made of glass material. The filter 5380 is disposed between the second array lens element 5320 of the optical layer 53 and the image sensor 35, and will not affect the focal length of the optical fingerprint identification system.

When user's finger is placed on the fingerprint contact surface of the cover, an organic light emitting diode display layer of the light emitting layer or another light source (not shown) can emit a sensing light towards the finger. The sensing light can be reflected off the finger and then sequentially passing through the cover, the light emitting layer, the first array lens element 5310, the aperture stop 5300 and the second array lens element 5320 of the optical layer 53 and the filter 5380 to emit towards the image sensor 35 on the base. The sensing light passing through the optical layer 53 can image on the image surface 35a of the image sensor 35 to generate optical signals, the optical signals can be converted to electrical signals by the image sensor 35, and the electrical signals can be transmitted to a processor (not shown). Electrical signals generated by light passing through several imaging units UNIT_5 would be collected to form an image for the processor to perform an identification process.

The detailed optical data of the 4th embodiment are shown in Table 5 and the aspheric surface data are shown in Table 6 below.

TABLE 5

4th Embodiment
f = 0.28 mm, Fno = 1.65, HFOV = 18.74 deg.

| Surface # | | Curvature Radius | | Thickness | Material | Index | Abbe # | Focal Length |
|---|---|---|---|---|---|---|---|---|
| 0 | Object | Plano | | 0 | | | | |
| 1 | Cover | Plano | | 1.500 | Glass | 1.517 | 64.2 | — |
| 2 | Light emitting layer | Plano | | 0.232 | | | | |
| 3 | | Plano | | −0.172 | | | | |
| 4 | 1st array lens element | 0.213 | (ASP) | 0.074 | Glass | 1.847 | 23.7 | 0.28 |
| 5 | | 1.644 | (ASP) | 0.055 | | | | |
| 6 | Light-blocking layer (Ape. Stop) | Plano | | 0.116 | | | | |
| 7 | 2nd array lens element | 0.125 | (ASP) | 0.015 | Glass | 1.628 | 36.2 | −1.42 |
| 8 | | 0.104 | (ASP) | 0.010 | | | | |
| 9 | Collimator layer | Plano | | 0.150 | | | | |
| 10 | Filter | Plano | | 0.020 | Glass | 1.517 | 64.2 | — |
| 11 | Image sensor | Plano | | — | | | | |

Note:
Reference wavelength is 550 nm.

TABLE 6

| Aspheric Coefficients | | | | |
|---|---|---|---|---|
| Surface # | 4 | 5 | 7 | 8 |
| k = | −1.2013E+00 | −7.8705E+01 | −1.7666E+01 | −1.0559E+00 |
| A4 = | 8.5406E+00 | −2.1937E+00 | 5.4500E+01 | −2.8418E+02 |
| A6 = | −3.8499E+02 | 6.5850E+02 | −2.7303E+04 | 1.1575E+04 |
| A8 = | 5.5486E+04 | −8.3593E+04 | −2.7802E+05 | −6.3715E+05 |
| A10 = | −3.7281E+06 | 3.2767E+06 | 8.3118E+07 | 4.1707E+07 |
| A12 = | 8.2513E+07 | −5.7714E+07 | −2.1446E+09 | −1.0838E+09 |
| A14 = | −5.4954E+08 | 3.9986E+08 | 1.5833E+10 | 8.8693E+09 |

In the 4th embodiment, the equation of the aspheric surface profiles of the aforementioned lens elements is the same as the equation of the 2nd embodiment. Also, the definitions of these parameters shown in the following table are the same as those stated in the 2nd embodiment with corresponding values for the 4th embodiment, so an explanation in this regard will not be provided again.

Moreover, these parameters can be calculated from Table 5 and Table 6 as the following values and satisfy the following conditions:

| 4th Embodiment | | | |
|---|---|---|---|
| f [mm] | 0.28 | OL/TL | 3.94 |
| Fno | 1.65 | TL/YRI | 1.08 |
| HFOV [deg.] | 18.7 | Vmin | 23.7 |
| N | 196 | CRA [deg.] | 63.5 |
| m (row) | 14 | AvgT500 [%] | 97.77 |
| n (column) | 14 | AvgT300 [%] | 0.06 |
| OL + TL [mm] | 2.0 | AvgT600 [%] | 0.97 |
| |YOB/YRI| | 1.0 | — | — |

5th Embodiment

Figure 8:
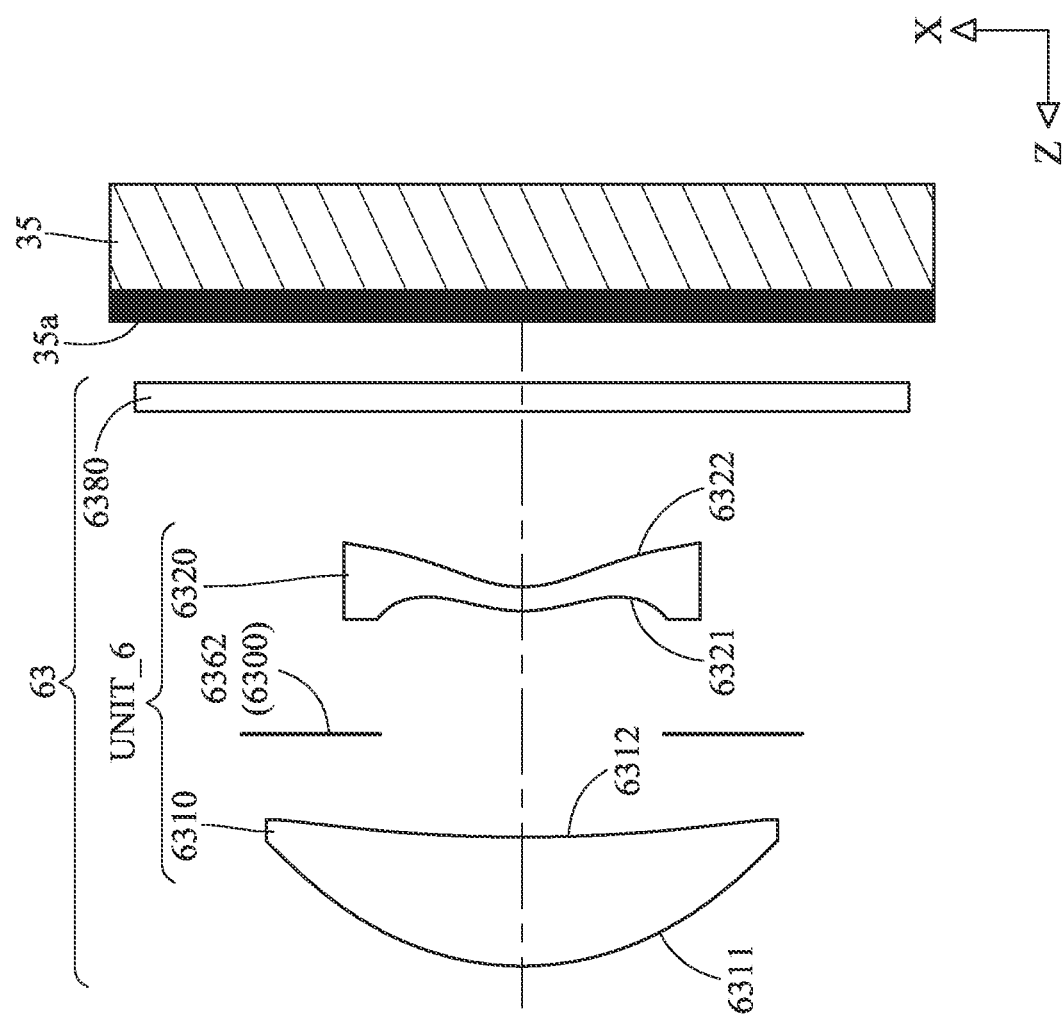
FIG. 8 is a schematic view of an imaging unit and an image sensor of the optical fingerprint identification system according to the 5th embodiment of the present disclosure.

Please refer to FIG. 8, which is a schematic view of an imaging unit and an image sensor of the optical fingerprint identification system according to the 5th embodiment of the present disclosure.

In this embodiment, the optical fingerprint identification system (not numbered) includes, in order from top to bottom in a stack direction Z, a cover (not shown), a light emitting layer (not shown), an optical layer 63, a collimator layer (not shown), an image sensor 35 and a base (not shown), wherein the structures of the cover, the light emitting layer, the collimator layer and the base are respectively similar to the structures of the cover 31, the light emitting layer 32, the collimator layer 34 and the base of the 2nd embodiment, and a description in this regard will not be provided again. Also, for simplicity, the cover, the light emitting layer, the collimator layer and the base are not illustrated in FIG. 8. In addition, the image sensor 35 and an image surface 35a shown in FIG. 8 are respectively the same as the elements with the same reference numbers in the 2nd embodiment. Hereinafter, only elements in the figure of this embodiment with different reference numbers from that of the above embodiments would be described.

The optical layer 63 includes a first array layer (not numbered) and a second array layer (not numbered). The first array layer is stacked on top of the second array layer in the stack direction Z. The first array layer includes a plurality of first array lens elements 6310 arranged at equal intervals in a first direction X. The second array layer includes a plurality of second array lens elements 6320 arranged at equal intervals in the first direction X. For simplicity, only one first array lens element 6310 and one second array lens element 6320 are illustrated in FIG. 8.

One first array lens element 6310 and one second array lens element 6320 in the optical layer 63 are coaxial along an optical axis and correspond to each other to form an imaging unit UNIT_6. The term of "correspond to each other" described herein refers to one first array lens element 6310 and one second array lens element 6320 having orthogonal projections overlapped with each other on the base. In other words, the one first array lens element 6310 and the one second array lens element 6320 are aligned with each other in the stack direction Z.

The first array lens element 6310 with positive refractive power has an upper surface 6311 being convex in a paraxial region thereof and a lower surface 6312 being concave in a paraxial region thereof. The first array lens element 6310 is made of glass material and has the upper surface 6311 and the lower surface 6312 being both aspheric. The upper surface 6311 of the first array lens element 6310 has at least one inflection point.

The second array lens element 6320 with negative refractive power has an upper surface 6321 being convex in a paraxial region thereof and a lower surface 6322 being concave in a paraxial region thereof. The second array lens element 6320 is made of glass material and has the upper surface 6321 and the lower surface 6322 being both aspheric. The upper surface 6321 of the second array lens element 6320 has at least one inflection point. The lower surface 6322 of the second array lens element 6320 has at least one inflection point. The upper surface 6321 of the second array lens element 6320 has at least one critical point in an off-axis region thereof.

The optical layer 63 further includes a light-blocking layer (not numbered). The light-blocking layer includes a light-blocking element layer 6362. The light-blocking element layer 6362 is disposed between the first array layer and the second array layer in the stack direction Z. It is noted that the light-blocking element layer 6362 has an opening (not numbered) located between the first array lens element 6310 and the second array lens element 6320 and aligned with the second array lens element 6320 in the stack direction Z, such that light can pass through the second array lens element 6320. In addition, an area of the light-blocking element layer 6362 surrounding the opening thereof can be regarded as an aperture stop 6300 disposed between the first array lens element 6310 and the second array lens element 6320.

The optical layer 63 further includes a filter 6380 made of glass material. The filter 6380 is disposed between the second array lens element 6320 of the optical layer 63 and the image sensor 35, and will not affect the focal length of the optical fingerprint identification system.

When user's finger is placed on the fingerprint contact surface of the cover, an organic light emitting diode display layer of the light emitting layer or another light source (not shown) can emit a sensing light towards the finger. The sensing light can be reflected off the finger and then sequentially passing through the cover, the light emitting layer, the first array lens element 6310, the aperture stop 6300 and the second array lens element 6320 of the optical layer 63 and the filter 6380 to emit towards the image sensor 35 on the base. The sensing light passing through the optical layer 63 can image on the image surface 35a of the image sensor 35 to generate optical signals, the optical signals can be converted to electrical signals by the image sensor 35, and the electrical signals can be transmitted to a processor (not shown). Electrical signals generated by light passing through several imaging units UNIT_6 would be collected to form an image for the processor to perform an identification process.

The detailed optical data of the 5th embodiment are shown in Table 7 and the aspheric surface data are shown in Table 8 below.

TABLE 7

5th Embodiment
f = 0.28 mm, Fno = 1.65, HFOV = 17.61 deg.

| Surface # | | Curvature Radius | | Thickness | Material | Index | Abbe # | Focal Length |
|---|---|---|---|---|---|---|---|---|
| 0 | Object | Plano | | 0 | | | | |
| 1 | Cover | Plano | | 1.500 | Glass | 1.517 | 64.2 | — |
| 2 | Light emitting layer | Plano | | 0.208 | | | | |
| 3 | | Plano | | −0.178 | | | | |
| 4 | 1st array lens element | 0.211 | (ASP) | 0.094 | Glass | 1.847 | 23.7 | 0.29 |
| 5 | | 1.231 | (ASP) | 0.075 | | | | |
| 6 | Light-blocking layer (Ape. Stop) | Plano | | 0.090 | | | | |
| 7 | 2nd array lens element | 0.104 | (ASP) | 0.017 | Glass | 1.631 | 59.5 | −0.87 |
| 8 | | 0.082 | (ASP) | 0.010 | | | | |
| 9 | Collimator layer | Plano | | 0.164 | | | | |
| 10 | Filter | Plano | | 0.020 | Glass | 1.517 | 64.2 | — |
| 11 | Image sensor | Plano | | — | | | | |

Note:
Reference wavelength is 550 nm.

TABLE 8

Aspheric Coefficients

| Surface # | 4 | 5 | 7 | 8 |
|---|---|---|---|---|
| k = | −9.4230E−01 | −2.3984E+01 | −9.5713E+00 | −1.4225E+00 |
| A4 = | 6.0361E+00 | 3.8716E+00 | 3.7635E+01 | −5.8035E+02 |
| A6 = | 6.9066E+01 | 1.4282E+02 | −9.8165E+04 | 5.2230E+04 |
| A8 = | 7.1258E+03 | −1.8708E+04 | 1.6023E+07 | −2.9462E+06 |
| A10 = | −4.2567E+05 | 5.5248E+05 | −1.3136E+09 | 9.6511E+07 |
| A12 = | 6.2594E+06 | −7.6236E+06 | 4.6744E+10 | −1.5028E+09 |
| A14 = | −2.7007E+07 | 4.6798E+07 | −5.4968E+11 | 8.3522E+09 |

In the 5th embodiment, the equation of the aspheric surface profiles of the aforementioned lens elements is the same as the equation of the 2nd embodiment. Also, the definitions of these parameters shown in the following table are the same as those stated in the 2nd embodiment with corresponding values for the 5th embodiment, so an explanation in this regard will not be provided again.

Moreover, these parameters can be calculated from Table 7 and Table 8 as the following values and satisfy the following conditions:

5th Embodiment

| f [mm] | 0.28 | OL/TL | 3.63 |
|---|---|---|---|
| Fno | 1.65 | TL/YRI | 1.18 |
| HFOV [deg.] | 17.6 | Vmin | 23.7 |
| N | 196 | CRA [deg.] | 61.7 |
| m (row) | 14 | AvgT500 [%] | 97.77 |
| n (column) | 14 | AvgT300 [%] | 0.06 |
| OL+ TL [mm] | 2.0 | AvgT600 [%] | 0.97 |
| |YOB/YRI| | 1.0 | — | — |

6th Embodiment

Figure 9:
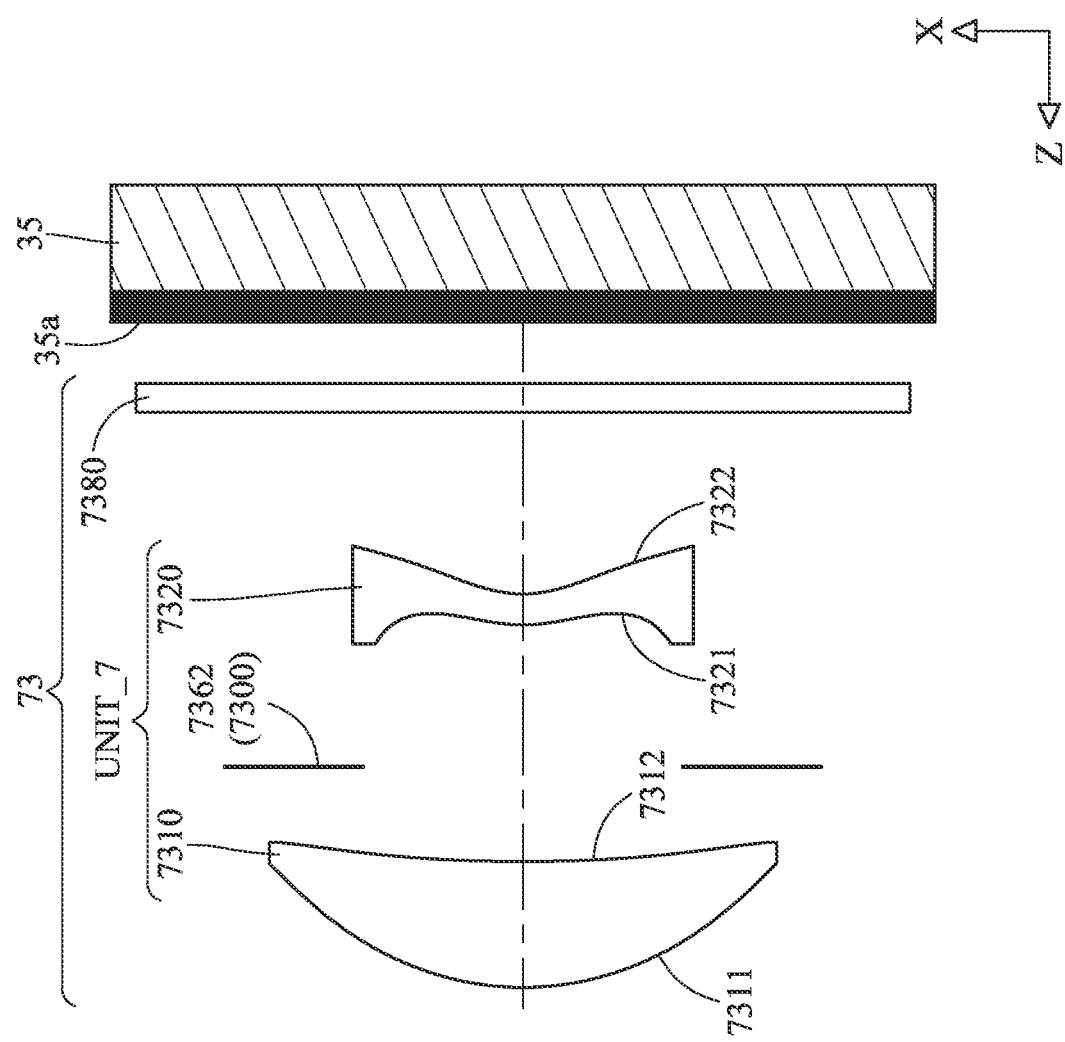
FIG. 9 is a schematic view of an imaging unit and an image sensor of the optical fingerprint identification system according to the 6th embodiment of the present disclosure.

Please refer to FIG. 9, which is a schematic view of an imaging unit and an image sensor of the optical fingerprint identification system according to the 6th embodiment of the present disclosure.

In this embodiment, the optical fingerprint identification system (not numbered) includes, in order from top to bottom in a stack direction Z, a cover (not shown), a light emitting layer (not shown), an optical layer 73, a collimator layer (not shown), an image sensor 35 and a base (not shown), wherein the structures of the cover, the light emitting layer, the collimator layer and the base are respectively similar to the structures of the cover 31, the light emitting layer 32, the collimator layer 34 and the base of the 2nd embodiment, and a description in this regard will not be provided again. Also, for simplicity, the cover, the light emitting layer, the collimator layer and the base are not illustrated in FIG. 9. In addition, the image sensor 35 and an image surface 35a shown in FIG. 9 are respectively the same as the elements with the same reference numbers in the 2nd embodiment. Hereinafter, only elements in the figure of this embodiment with different reference numbers from that of the above embodiments would be described.

The optical layer 73 includes a first array layer (not numbered) and a second array layer (not numbered). The first array layer is stacked on top of the second array layer in the stack direction Z. The first array layer includes a plurality of first array lens elements 7310 arranged at equal intervals in a first direction X. The second array layer includes a plurality of second array lens elements 7320 arranged at equal intervals in the first direction X. For simplicity, only one first array lens element 7310 and one second array lens element 7320 are illustrated in FIG. 9.

One first array lens element 7310 and one second array lens element 7320 in the optical layer 73 are coaxial along an optical axis and correspond to each other to form an imaging unit UNIT_7. The term of "correspond to each other" described herein refers to one first array lens element 7310 and one second array lens element 7320 having orthogonal projections overlapped with each other on the base. In other words, the one first array lens element 7310 and the one second array lens element 7320 are aligned with each other in the stack direction Z.

The first array lens element 7310 with positive refractive power has an upper surface 7311 being convex in a paraxial region thereof and a lower surface 7312 being concave in a paraxial region thereof. The first array lens element 7310 is made of glass material and has the upper surface 7311 and the lower surface 7312 being both aspheric. The upper surface 7311 of the first array lens element 7310 has at least one inflection point. The lower surface 7312 of the first array lens element 7310 has at least one inflection point.

The second array lens element 7320 with negative refractive power has an upper surface 7321 being convex in a paraxial region thereof and a lower surface 7322 being concave in a paraxial region thereof. The second array lens element 7320 is made of glass material and has the upper surface 7321 and the lower surface 7322 being both aspheric. The upper surface 7321 of the second array lens element 7320 has at least one inflection point. The lower surface 7322 of the second array lens element 7320 has at least one inflection point. The upper surface 7321 of the second array lens element 7320 has at least one critical point in an off-axis region thereof.

The optical layer 73 further includes a light-blocking layer (not numbered). The light-blocking layer includes a light-blocking element layer 7362. The light-blocking element layer 7362 is disposed between the first array layer and the second array layer in the stack direction Z. It is noted that the light-blocking element layer 7362 has an opening (not numbered) located between the first array lens element 7310 and the second array lens element 7320 and aligned with the second array lens element 7320 in the stack direction Z, such that light can pass through the second array lens element 7320. In addition, an area of the light-blocking element layer 7362 surrounding the opening thereof can be regarded as an aperture stop 7300 disposed between the first array lens element 7310 and the second array lens element 7320.

The optical layer 73 further includes a filter 7380 made of glass material. The filter 7380 is disposed between the second array lens element 7320 of the optical layer 73 and the image sensor 35, and will not affect the focal length of the optical fingerprint identification system.

When user's finger is placed on the fingerprint contact surface of the cover, an organic light emitting diode display layer of the light emitting layer or another light source (not shown) can emit a sensing light towards the finger. The sensing light can be reflected off the finger and then sequentially passing through the cover, the light emitting layer, the first array lens element 7310, the aperture stop 7300 and the second array lens element 7320 of the optical layer 73 and the filter 7380 to emit towards the image sensor 35 on the base. The sensing light passing through the optical layer 73 can image on the image surface 35a of the image sensor 35 to generate optical signals, the optical signals can be converted to electrical signals by the image sensor 35, and the electrical signals can be transmitted to a processor (not shown). Electrical signals generated by light passing through several imaging units UNIT_7 would be collected to form an image for the processor to perform an identification process.

The detailed optical data of the 6th embodiment are shown in Table 9 and the aspheric surface data are shown in Table 10 below.

TABLE 9

6th Embodiment
f = 0.29 mm, Fno = 1.65, HFOV = 17.41 deg.

| Surface # | | Curvature Radius | | Thickness | Material | Index | Abbe # | Focal Length |
|---|---|---|---|---|---|---|---|---|
| 0 | Object | Plano | | 0 | | | | |
| 1 | Cover | Plano | | 1.500 | Glass | 1.517 | 64.2 | — |
| 2 | Light emitting layer | Plano | | 0.161 | | | | |
| 3 | | Plano | | −0.146 | | | | |
| 4 | 1st array lens element | 0.213 | (ASP) | 0.092 | Glass | 1.847 | 23.7 | 0.29 |
| 5 | | 1.169 | (ASP) | 0.069 | | | | |
| 6 | Light-blocking layer (Ape. Stop) | Plano | | 0.103 | | | | |
| 7 | 2nd array lens element | 0.115 | (ASP) | 0.022 | Glass | 1.517 | 64.1 | −0.83 |
| 8 | | 0.085 | (ASP) | 0.010 | | | | |
| 9 | Collimator layer | Plano | | 0.168 | | | | |
| 10 | Filter | Plano | | 0.020 | Glass | 1.517 | 64.2 | — |
| 11 | Image sensor | Plano | | — | | | | |

Note:
Reference wavelength is 550 nm.

TABLE 10

Aspheric Coefficients

| Surface # | 4 | 5 | 7 | 8 |
|---|---|---|---|---|
| k = | −8.9063E−01 | −1.5984E+01 | −1.7210E+01 | −1.0262E+00 |
| A4 = | 6.4776E+00 | 3.5263E+00 | 1.5415E+02 | −5.6785E+02 |
| A6 = | 2.0213E+01 | 2.0842E+02 | −1.2730E+05 | 4.3608E+04 |
| A8 = | 8.2508E+03 | −1.3812E+04 | 2.0076E+07 | −2.2206E+06 |
| A10 = | −2.6574E+05 | 1.0106E+05 | −1.6332E+09 | 6.6529E+07 |
| A12 = | 9.8024E+04 | 3.3365E+06 | 5.8412E+10 | −9.5960E+08 |
| A14 = | 2.2359E+07 | −4.4506E+07 | −6.8650E+11 | 4.9832E+09 |

In the 6th embodiment, the equation of the aspheric surface profiles of the aforementioned lens elements is the same as the equation of the 2nd embodiment. Also, the definitions of these parameters shown in the following table are the same as those stated in the 2nd embodiment with corresponding values for the 6th embodiment, so an explanation in this regard will not be provided again.

Moreover, these parameters can be calculated from Table 9 and Table 10 as the following values and satisfy the following conditions:

| 6th Embodiment | | | |
|---|---|---|---|
| f [mm] | 0.29 | OL/TL | 3.42 |
| Fno | 1.65 | TL/YRI | 1.28 |
| HFOV [deg.] | 17.4 | Vmin | 23.7 |
| N | 225 | CRA [deg.] | 59.3 |
| m (row) | 15 | AvgT500 [%] | 97.77 |
| n (column) | 15 | AvgT300 [%] | 0.06 |
| OL + TL [mm] | 2.0 | AvgT600 [%] | 0.97 |
| |YOB/YRI| | 1.0 | — | |

7th Embodiment

In the 2nd embodiment through the 6th embodiment, light with specific wavelengths would be filtered by the filter 3380, 4380, 5380, 6380 or 7380, but the present disclosure is not limited thereto. Please refer to FIG. 12, which is a schematic view of an imaging unit and an image sensor coupled with a filter coating layer of the optical fingerprint identification system according to the 7th embodiment of the present disclosure.

Figure 12:
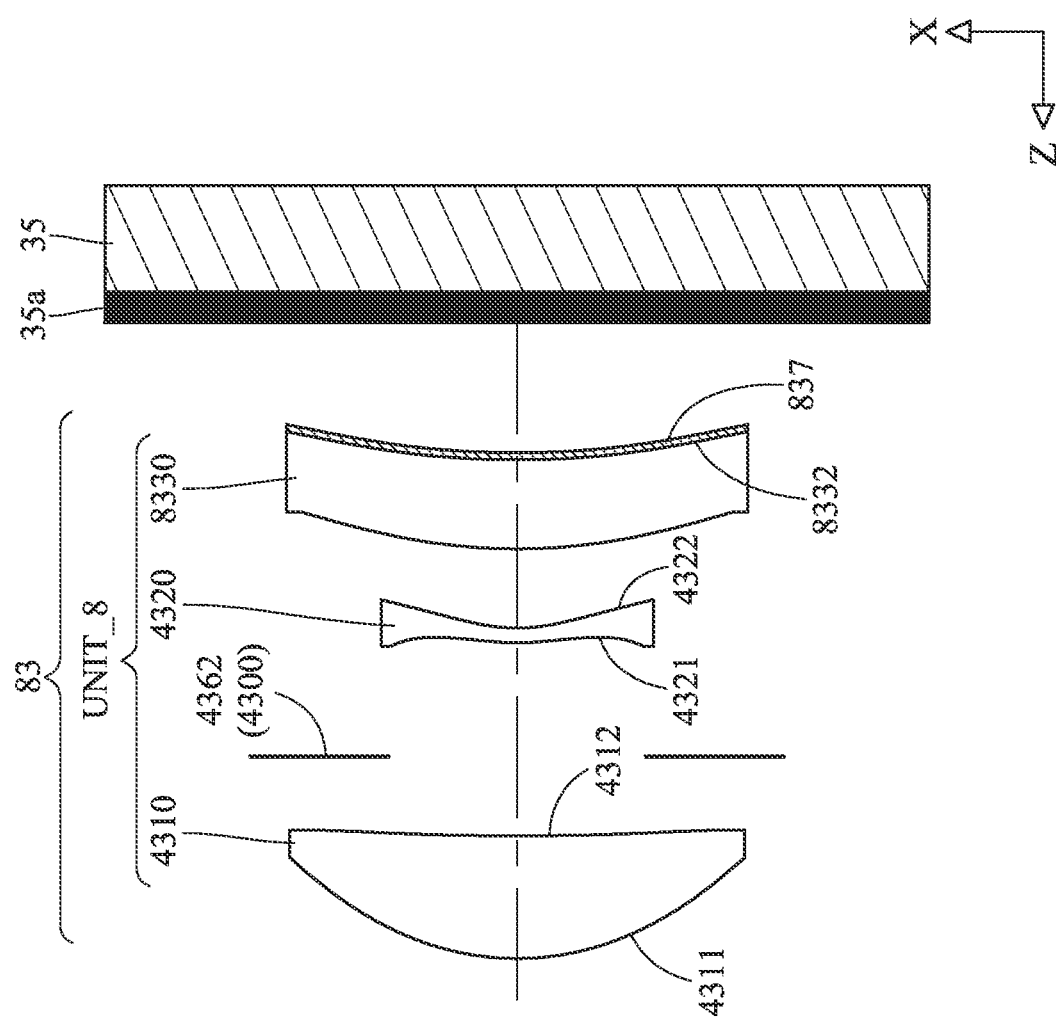
FIG. 12 is a schematic view of an imaging unit and an image sensor coupled with a filter coating layer of the optical fingerprint identification system according to the 7th embodiment of the present disclosure.

In this embodiment, the optical fingerprint identification system (not numbered) includes, in order from top to bottom in a stack direction Z, a cover (not shown), a light emitting layer (not shown), an optical layer 83, a collimator layer (not shown), an image sensor 35 and a base (not shown), wherein the structures of the cover, the light emitting layer, the collimator layer and the base are respectively similar to the structures of the cover 31, the light emitting layer 32, the collimator layer 34 and the base of the 2nd embodiment, and a description in this regard will not be provided again. Also, for simplicity, the cover, the light emitting layer, the collimator layer and the base are not illustrated in FIG. 12. In addition, the image sensor 35, an image surface 35a, a first array lens element 4310, a second array lens element 4320 and a light-blocking element layer 4362 shown in FIG. 12 are respectively the same as the elements with the same reference numbers in the 2nd embodiment or the 3rd embodiment. Hereinafter, only elements in the figure of this embodiment with different reference numbers from that of the above embodiments would be described.

In this embodiment, the optical layer 83 further includes a filter coating layer 837 coated on a lower surface 8332 of a third array lens element 8330 of an imaging units UNIT_8. The filter coating layer 837 will not affect the focal length of the optical fingerprint identification system. The filter coating layer 837 can filter light with specific wavelengths to achieve a filter function and thus can replace the filter of each of the abovementioned embodiments. The filter function of the filter coating layer 837 can be referred to foregoing descriptions about the bandpass filter layer corresponding to FIG. 14 so the details in this regard will not be provided again.

8th Embodiment

In the 7th embodiment, light with specific wavelengths would be filtered by the filter coating layer 837, but the present disclosure is not limited thereto. Please refer to FIG. 13, which is a schematic view of an imaging unit and an image sensor coupled with a filter material of the optical fingerprint identification system according to the 8th embodiment of the present disclosure.

Figure 13:
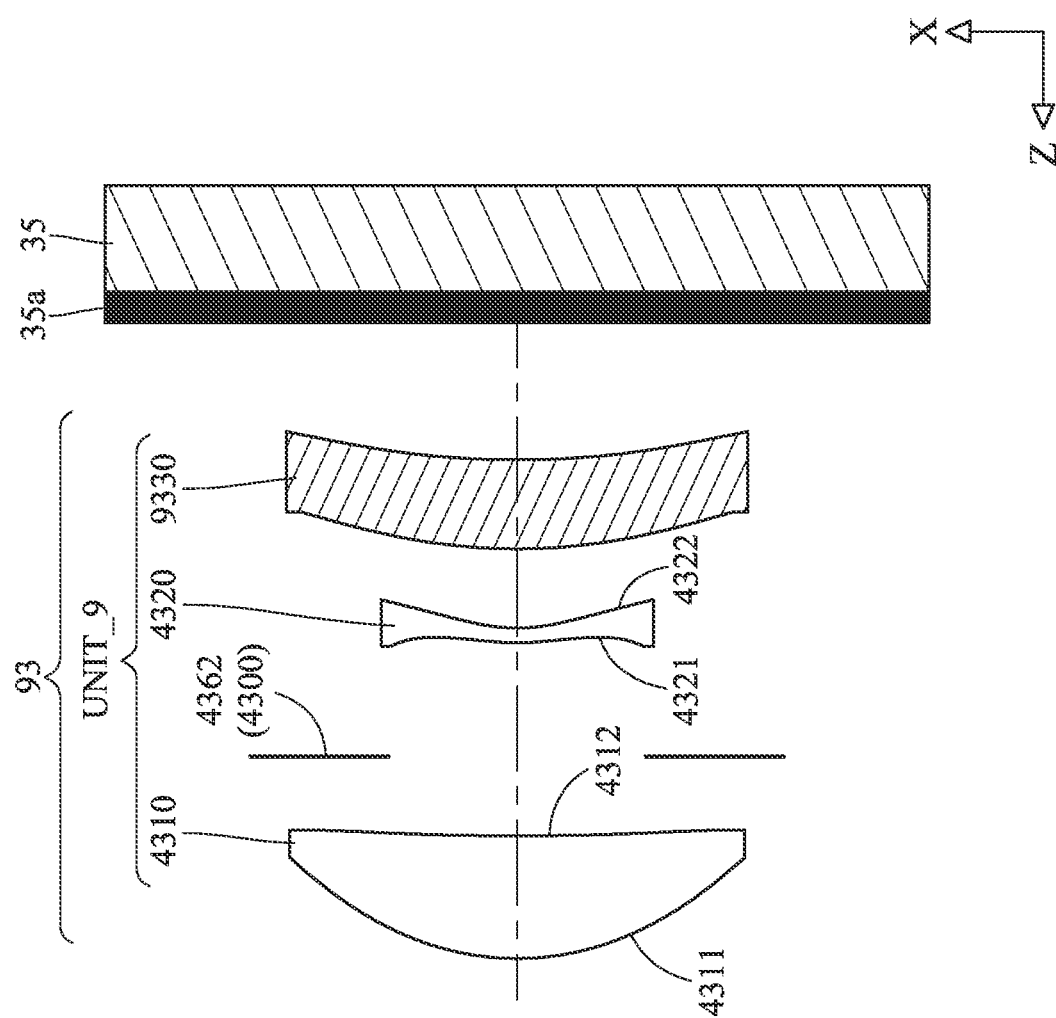
FIG. 13 is a schematic view of an imaging unit and an image sensor coupled with a filter material of the optical fingerprint identification system according to the 8th embodiment of the present disclosure.

In this embodiment, the optical fingerprint identification system (not numbered) includes, in order from top to bottom in a stack direction Z, a cover (not shown), a light emitting layer (not shown), an optical layer 93, a collimator layer (not shown), an image sensor 35 and a base (not shown), wherein the structures of the cover, the light emitting layer, the collimator layer and the base are respectively similar to the structures of the cover 31, the light emitting layer 32, the collimator layer 34 and the base of the 2nd embodiment, and a description in this regard will not be provided again. Also, for simplicity, the cover, the light emitting layer, the collimator layer and the base are not illustrated in FIG. 13. In addition, the image sensor 35, an image surface 35a, a first array lens element 4310, a second array lens element 4320 and a light-blocking element layer 4362 shown in FIG. 13 are respectively the same as the elements with the same reference numbers in the 2nd embodiment or the 3rd embodiment. Hereinafter, only elements in the figure of this embodiment with different reference numbers from that of the above embodiments would be described.

In this embodiment, a third array lens element 9330 of an imaging unit UNIT_9 is made of filter material, and will not affect the focal length of the optical fingerprint identification system. The filter material of the third array lens element 9330 can absorb light with specific wavelengths to achieve a filter function and thus can replace the filter of each of the abovementioned embodiments.

9th Embodiment

In the 1st embodiment through the 8th embodiment, light would be guided by the collimator layer 14 or 34, but the present disclosure is not limited thereto. Please refer to FIG. 15, which is a schematic view of an imaging unit and an image sensor coupled with a light interference filter layer and a light absorption filter layer of the optical fingerprint identification system according to the 9th embodiment of the present disclosure.

Figure 15:
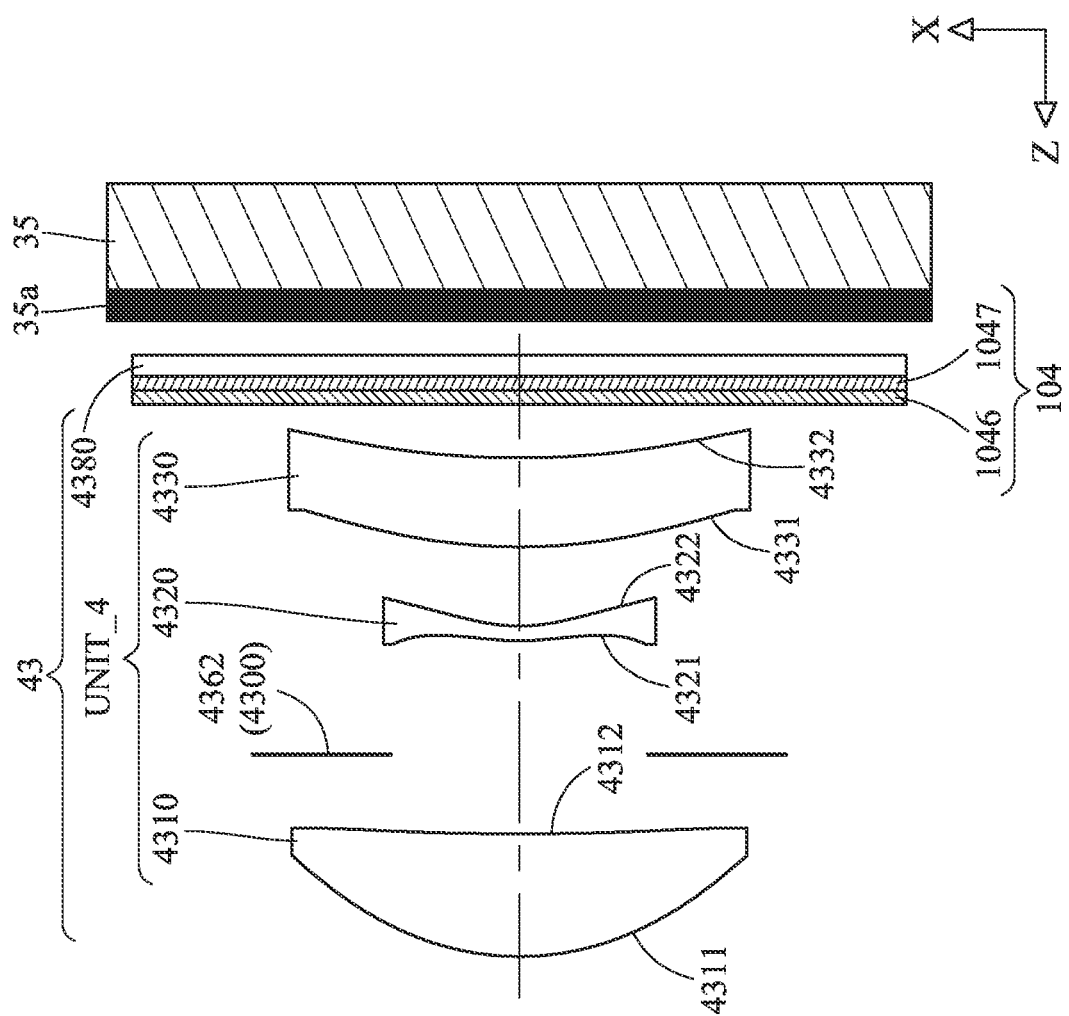
FIG. 15 is a schematic view of an imaging unit and an image sensor coupled with a light interference filter layer and a light absorption filter layer of the optical fingerprint identification system according to the 9th embodiment of the present disclosure.

In this embodiment, the optical fingerprint identification system (not numbered) includes, in order from top to bottom in a stack direction Z, a cover (not shown), a light emitting layer (not shown), an optical layer 43, a first collimator layer (not shown), a second collimator layer 104, an image sensor 35 and a base (not shown), wherein the structures of the cover, the light emitting layer, the first collimator layer and the base are respectively similar to the structures of the cover 31, the light emitting layer 32, the collimator layer 34 and the base of the 2nd embodiment, and a description in this regard will not be provided again. Also, for simplicity, the cover, the light emitting layer, the first collimator layer and the base are not illustrated in FIG. 15. In addition, the image sensor 35, an image surface 35a and the optical layer 43 shown in FIG. 15 are respectively the same as the elements with the same reference numbers in the 2nd embodiment or the 3rd embodiment. Hereinafter, only elements in the figure of this embodiment with different reference numbers from that of the above embodiments would be described.

In this embodiment, the second collimator layer 104 is a filter medium layer disposed on the filter 4380, and will not affect the focal length of the optical fingerprint identification system. The second collimator layer 104 includes a light interference filter layer 1046 and a light absorption filter layer 1047. The light interference filter layer 1046 is a bandpass filter layer, and the light absorption filter layer 1047 is an edgepass filter layer. Since the light interference filter layer 1046 can provide a filter bandwidth shift according to a change of an incident light angle thereon, and only light with specific wavelengths can pass through the light absorption filter layer 1047, light passing through the second collimator layer 104 can be guided to provide an incident angle closer to normal towards the image sensor 35 so as to achieve a collimate function. The collimate function of the second collimator layer 104 can be referred to foregoing descriptions corresponding to FIG. 16 so the details in this regard will not be provided again.

10th Embodiment

In the 1st embodiment through the 9th embodiment, light would be converged to form images by general lens elements, but the present disclosure is not limited thereto. Please refer to FIG. 17, which is a schematic view of an imaging unit and an image sensor coupled with a Fresnel lens element of the optical fingerprint identification system according to the 10th embodiment of the present disclosure.

Figure 17:
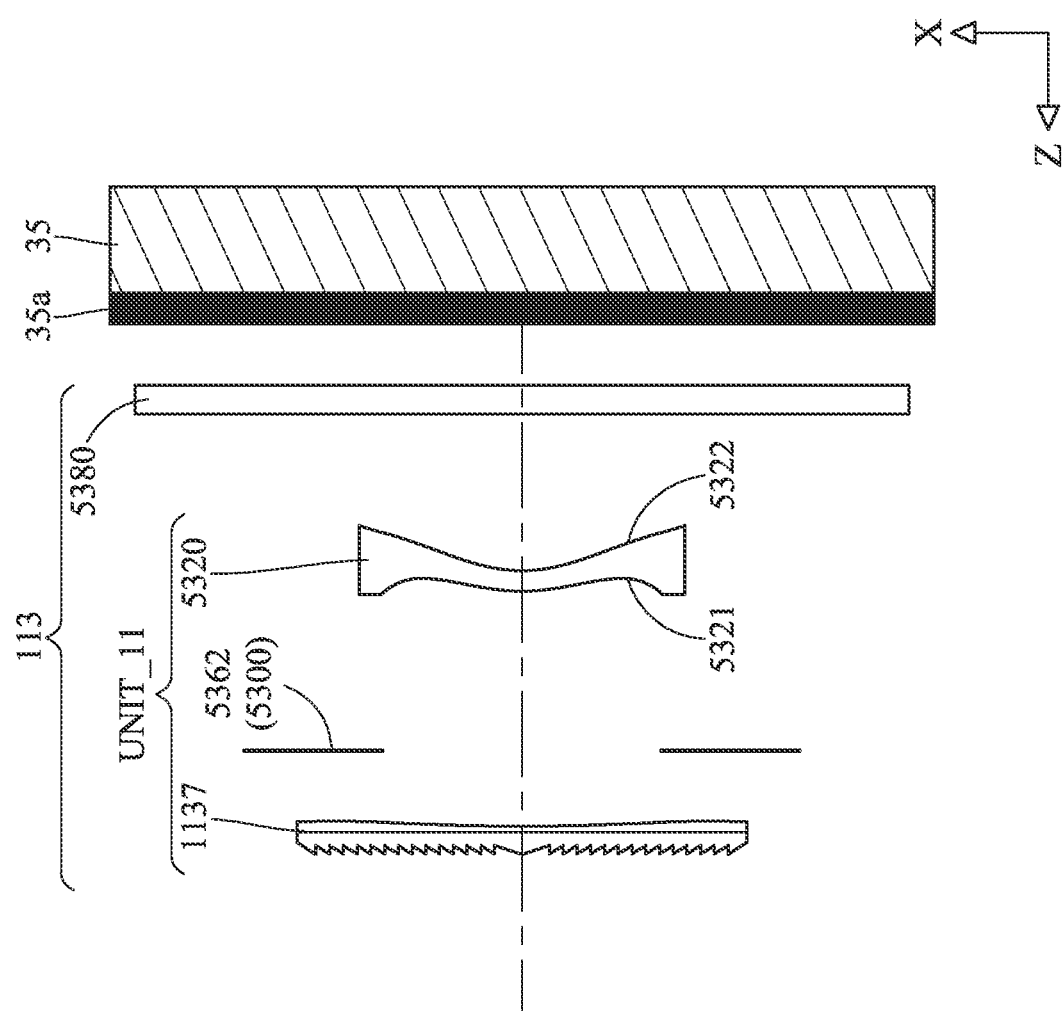
FIG. 17 is a schematic view of an imaging unit and an image sensor coupled with a Fresnel lens element of the optical fingerprint identification system according to the 10th embodiment of the present disclosure.

In this embodiment, the optical fingerprint identification system (not numbered) includes, in order from top to bottom in a stack direction Z, a cover (not shown), a light emitting layer (not shown), an optical layer 113, a collimator layer (not shown), an image sensor 35 and a base (not shown), wherein the structures of the cover, the light emitting layer, the collimator layer and the base are respectively similar to the structures of the cover 31, the light emitting layer 32, the collimator layer 34 and the base of the 2nd embodiment, and a description in this regard will not be provided again. Also, for simplicity, the cover, the light emitting layer, the first collimator layer and the base are not illustrated in FIG. 17. In addition, the image sensor 35, an image surface 35a, a second array lens element 5320, a light-blocking element layer 5362 and a filter 5380 shown in FIG. 17 are respectively the same as the elements with the same reference numbers in the 2nd embodiment or the 4th embodiment. Hereinafter, only elements in the figure of this embodiment with different reference numbers from that of the above embodiments would be described.

The optical layer 113 further includes a plurality of Fresnel lens elements 1137, and only one Fresnel lens element 1137 is illustrated in FIG. 17 for simplicity. In this embodiment, the difference between the optical layer 113 and the optical layer 53 of the 4th embodiment is that the Fresnel lens elements 1137 are used to replace the first array lens elements 5310. Therefore, it is favorable for further reducing the total height of the optical fingerprint identification system by utilizing the Fresnel lens elements 1137 of a relatively thin thickness. In addition, one Fresnel lens element 1137 and one second array lens element 5320 in the optical layer 113 are coaxial along an optical axis and correspond to each other to form an imaging unit UNIT_11.

11th Embodiment

In the 10th embodiment, light would be converged to form images by the Fresnel lens elements 1137, but the present disclosure is not limited thereto. Please refer to FIG. 18, which is a schematic view of an imaging unit and an image sensor coupled with a metalens element of the optical fingerprint identification system according to the 11th embodiment of the present disclosure.

Figure 18:
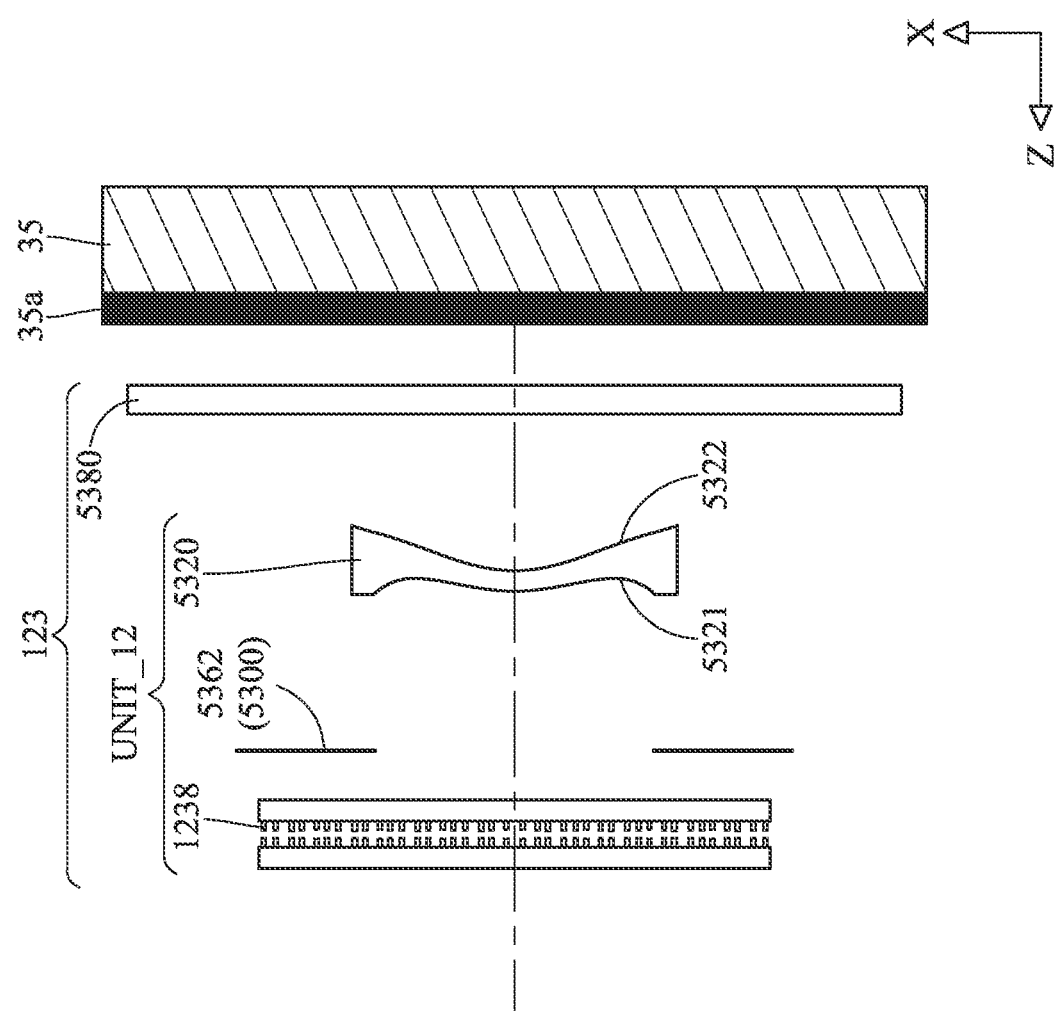
FIG. 18 is a schematic view of an imaging unit and an image sensor coupled with a metalens element of the optical fingerprint identification system according to the 11th embodiment of the present disclosure.

In this embodiment, the optical fingerprint identification system (not numbered) includes, in order from top to bottom in a stack direction Z, a cover (not shown), a light emitting layer (not shown), an optical layer 123, a collimator layer (not shown), an image sensor 35 and a base (not shown), wherein the structures of the cover, the light emitting layer, the collimator layer and the base are respectively similar to the structures of the cover 31, the light emitting layer 32, the collimator layer 34 and the base of the 2nd embodiment, and a description in this regard will not be provided again. Also, for simplicity, the cover, the light emitting layer, the first collimator layer and the base are not illustrated in FIG. 18. In addition, the image sensor 35, an image surface 35a, a second array lens element 5320, a light-blocking element layer 5362 and a filter 5380 shown in FIG. 18 are respectively the same as the elements with the same reference numbers in the 2nd embodiment or the 4th embodiment. Hereinafter, only elements in the figure of this embodiment with different reference numbers from that of the above embodiments would be described.

The optical layer 123 further includes a plurality of metalens elements 1238, and only one metalens element 1238 is illustrated in FIG. 18 for simplicity. In this embodiment, the difference between the optical layer 123 and the optical layer 53 of the 4th embodiment is that the metalens elements 1238 are used to replace the first array lens elements 5310. Therefore, it is favorable for further reducing the total height of the optical fingerprint identification system by utilizing the metalens elements 1238 of a relatively thin thickness. In addition, one metalens element 1238 and one second array lens element 5320 in the optical layer 123 are coaxial along an optical axis and correspond to each other to form an imaging unit UNIT_12.

The smartphone in the 1st embodiment is only exemplary for showing the optical fingerprint identification system 10 of the present disclosure applied to the electronic device 1 for providing the in-display fingerprint identification function, and the present disclosure is not limited thereto. The electronic device 1 may alternatively be provided with the optical fingerprint identification system disclosed in other embodiments of the present disclosure. Furthermore, the optical fingerprint identification system of each of the embodiments of the present disclosure feature good capability in aberration corrections and high image quality, and can be applied to digital tablets, portable video recorders, multi-camera devices and other electronic imaging devices.

The foregoing description, for the purpose of explanation, has been described with reference to specific embodiments. It is to be noted that TABLES 1-10 show different data of the different embodiments; however, the data of the different embodiments are obtained from experiments. The embodiments were chosen and described in order to best explain the principles of the disclosure and its practical applications, to thereby enable others skilled in the art to best utilize the disclosure and various embodiments with various modifications as are suited to the particular use contemplated. The embodiments depicted above and the appended drawings are exemplary and are not intended to be exhaustive or to limit the scope of the present disclosure to the precise forms disclosed. Many modifications and variations are possible in view of the above teachings.

What is claimed is:

1. An optical fingerprint identification system, comprising:
 a cover, having a fingerprint contact surface on top;
 a light emitting layer, disposed below the cover;
 an optical layer, disposed below the light emitting layer;
 an image sensor, disposed below the optical layer, wherein the image sensor has an image surface; and
 a base, disposed below the image sensor;
 wherein the optical layer comprises a first array layer and a second array layer, and the first array layer is stacked on top of the second array layer;
 wherein the first array layer comprises a plurality of first array lens elements arranged at equal intervals in a first direction, and the second array layer comprises a plurality of second array lens elements arranged at equal intervals in the first direction;
 wherein each of the first array lens elements and a corresponding second array lens element of the second array layer are coaxial along an optical axis and form an imaging unit;
 wherein a total number of the imaging units in the optical fingerprint identification system is N, an axial distance between the fingerprint contact surface and an upper surface of the first array lens element is OL, an axial distance between the upper surface of the first array lens element and the image surface is TL, and the following conditions are satisfied:

$120 < N < 900$; and $OL + TL < 3.0$ [mm].

2. The optical fingerprint identification system of claim 1, wherein an object height corresponding to each of the imaging units is YOB, an image height corresponding to each of the imaging units is YRI, and the following condition is satisfied:

$|YOB/YRI|<1.5$.

3. The optical fingerprint identification system of claim 1, wherein an f-number of each imaging unit in the optical fingerprint identification system is Fno, and the following condition is satisfied:

$1.0<Fno<2.2$.

4. The optical fingerprint identification system of claim 3, wherein the axial distance between the upper surface of the first array lens element and the image surface is TL, an image height corresponding to each of the imaging units is YRI, and the following condition is satisfied:

$TL/YRI<2.0$.

5. The optical fingerprint identification system of claim 1, wherein the total number of the imaging units in the optical fingerprint identification system is N, and the following condition is satisfied:

$150<N<650$.

6. The optical fingerprint identification system of claim 1, wherein the plurality of first array lens elements have positive refractive power, and the plurality of second array lens elements have negative refractive power.

7. The optical fingerprint identification system of claim 6, wherein the optical layer further comprises a third array layer stacked between the second array layer and the image sensor, and the third array layer comprises a plurality of third array lens elements arranged at equal intervals in the first direction.

8. The optical fingerprint identification system of claim 7, wherein the plurality of third array lens elements have positive refractive power.

9. The optical fingerprint identification system of claim 7, wherein an Abbe number of each of the plurality of first array lens elements is V1, an Abbe number of each of the plurality of second array lens elements is V2, an Abbe number of each of the plurality of third array lens elements is V3, and the following condition is satisfied:

$V1+V2+V3<100$.

10. The optical fingerprint identification system of claim 1, wherein a minimum value among Abbe numbers of all array lens elements of the optical layer is Vmin, and the following condition is satisfied:

$Vmin<30$.

11. The optical fingerprint identification system of claim 1, wherein at least one of all array lens elements of the optical layer has at least one of an upper surface and a lower surface having at least one inflection point.

12. The optical fingerprint identification system of claim 1, wherein a chief ray angle at a maximum image height position of the image sensor is smaller than 45 degrees.

13. The optical fingerprint identification system of claim 1, wherein the optical layer further comprises at least one light-blocking layer disposed above or below one of the first array layer and the second array layer.

14. The optical fingerprint identification system of claim 1, wherein the optical layer further comprises at least one filter coating layer disposed on at least one of an upper surface and a lower surface of at least one of all array lens elements of the optical layer;
wherein an average light transmittance of a wavelength range between 500 and 570 nanometers passing through the at least one filter coating layer is AvgT500, an average light transmittance of a wavelength range between 300 and 400 nanometers passing through the at least one filter coating layer is AvgT300, an average light transmittance of a wavelength range between 600 and 700 nanometers passing through the at least one filter coating layer is AvgT600, and the following conditions are satisfied:

$AvgT500>70\%$;

$AvgT300<30\%$; and $AvgT600<30\%$.

15. The optical fingerprint identification system of claim 1, further comprising a collimator layer disposed above the image sensor, wherein the collimator layer comprises a lattice partition, and the lattice partition has an inner wall made of light-absorbing material.

16. The optical fingerprint identification system of claim 1, further comprising a collimator layer disposed above the image sensor, wherein the collimator layer comprises a light interference filter layer and a light absorption filter layer.

17. The optical fingerprint identification system of claim 1, wherein the optical layer further comprises a metalens element.

18. The optical fingerprint identification system of claim 1, wherein the light emitting layer comprises an organic light emitting diode display layer.

19. An optical fingerprint identification system, comprising:
a cover, having a fingerprint contact surface on top;
a light emitting layer, disposed below the cover;
an optical layer, disposed below the light emitting layer;
an image sensor, disposed below the optical layer, wherein the image sensor has an image surface; and
a base, disposed below the image sensor;
wherein the optical layer comprises a first array layer and a second array layer, and the first array layer is stacked on top of the second array layer;
wherein the first array layer comprises a plurality of first array lens elements arranged at equal intervals in a first direction, and the second array layer comprises a plurality of second array lens elements arranged at equal intervals in the first direction;
wherein each of the first array lens elements and a corresponding second array lens element of the second array layer are coaxial along an optical axis and form an imaging unit;
wherein an axial distance between the fingerprint contact surface and an upper surface of the first array lens element is OL, an axial distance between the upper surface of the first array lens element and the image surface is TL, an object height corresponding to each of the imaging units is YOB, an image height corresponding to each of the imaging units is YRI, and the following conditions are satisfied:

$OL+TL<3.0$ [mm];

$|YOB/YRI|<1.5$; and $2.5<OL/TL$.

20. The optical fingerprint identification system of claim 19, wherein the axial distance between the fingerprint contact surface and the upper surface of the first array lens element is OL, the axial distance between the upper surface of the first array lens element and the image surface is TL, and the following condition is satisfied:

$3.5 < OL/TL.$

21. The optical fingerprint identification system of claim 19, wherein an f-number of each imaging unit in the optical fingerprint identification system is Fno, the axial distance between the upper surface of the first array lens element and the image surface is TL, the image height corresponding to each of the imaging units is YRI, and the following conditions are satisfied:

$1.0 < Fno < 2.2;$ and $TL/YRI < 2.0.$

22. The optical fingerprint identification system of claim 19, wherein the plurality of first array lens elements have positive refractive power, and the plurality of second array lens elements have negative refractive power.

23. The optical fingerprint identification system of claim 22, wherein the optical layer further comprises a third array layer stacked between the second array layer and the image sensor, and the third array layer comprises a plurality of third array lens elements arranged at equal intervals in the first direction.

24. The optical fingerprint identification system of claim 19, wherein a minimum value among Abbe numbers of all array lens elements of the optical layer is Vmin, and the following condition is satisfied:

$Vmin < 30.$

25. The optical fingerprint identification system of claim 19, wherein at least one of all array lens elements of the optical layer has at least one of an upper surface and a lower surface having at least one inflection point.

26. The optical fingerprint identification system of claim 19, wherein the optical layer further comprises at least one filter coating layer disposed on at least one of an upper surface and a lower surface of at least one of all array lens elements of the optical layer;

wherein an average light transmittance of a wavelength range between 500 and 570 nanometers passing through the at least one filter coating layer is AvgT500, an average light transmittance of a wavelength range between 300 and 400 nanometers passing through the at least one filter coating layer is AvgT300, an average light transmittance of a wavelength range between 600 and 700 nanometers passing through the at least one filter coating layer is AvgT600, and the following conditions are satisfied:

$AvgT500 > 70\%;$ $AvgT300 < 30\%;$ and $AvgT600 < 30\%.$

27. The optical fingerprint identification system of claim 19, further comprising a collimator layer disposed above the image sensor, wherein the collimator layer comprises a lattice partition, and the lattice partition has an inner wall made of light-absorbing material.

28. The optical fingerprint identification system of claim 19, further comprising a collimator layer disposed above the image sensor, wherein the collimator layer comprises a light interference filter layer and a light absorption filter layer.

29. The optical fingerprint identification system of claim 19, wherein the light emitting layer comprises an organic light emitting diode display layer.

30. The optical fingerprint identification system of claim 19, wherein a total number of the imaging units in the optical fingerprint identification system is N, and the following condition is satisfied:

$150 < N < 650.$

* * * * *